United States Patent [19]
Hansen et al.

[11] Patent Number: 6,138,694
[45] Date of Patent: Oct. 31, 2000

[54] MULTIPLE STAGE WET PROCESSING PLATFORM AND METHOD OF USE

[75] Inventors: Eric T. Hansen; William Warren Becia; Thomas Wayne Ives; Victor B. Mimken, all of Boise; Randy Mark Hall, Meridian; Thomas Krawzak, Boise, all of Id.

[73] Assignee: SCP Global Technologies, Boise, Id.

[21] Appl. No.: 09/263,384

[22] Filed: Mar. 5, 1999

Related U.S. Application Data

[60] Provisional application No. 60/007,005, Mar. 6, 1998, and provisional application No. 60/103,648, Oct. 9, 1998.

[51] Int. Cl.$^7$ ........................................................ B08B 7/04
[52] U.S. Cl. ............................ 134/58 R; 134/61; 134/66; 134/902
[58] Field of Search ................................ 134/902, 61, 66, 134/57 R, 58 R

[56] References Cited

U.S. PATENT DOCUMENTS

| | | | |
|---|---|---|---|
| 4,282,825 | 8/1981 | Nagatomo et al. | 134/66 X |
| 4,936,328 | 6/1990 | Yatabe | 134/66 |
| 5,383,482 | 1/1995 | Yamada et al. | 134/66 |
| 5,810,028 | 9/1998 | Ichikawa et al. | 134/902 X |
| 5,950,643 | 9/1999 | Miyazaki et al. | 134/61 X |
| 5,954,888 | 9/1999 | Gupta et al. | 134/902 X |
| 5,964,954 | 10/1999 | Matsukawa et al. | 134/902 |
| 6,007,675 | 12/1999 | Toshima | 134/61 X |
| 6,009,890 | 1/2000 | Kaneko et al. | 134/902 X |

FOREIGN PATENT DOCUMENTS

| | | | |
|---|---|---|---|
| 256326 | 11/1991 | Japan | 134/902 |

*Primary Examiner*—Philip R. Coe
*Attorney, Agent, or Firm*—Limbach & Limbach L.L.P.

[57] ABSTRACT

A multiple stage wet processing platform includes a sealable enclosure, at least two processing modules positioned within the enclosure, at least one of them including a housing having an opening and a door moveable into position covering the opening, at least two processing vessels within the housing, and an intra-module robot within the housing and including a wafer support member, the intra-module robot moveable to a first position in which the support is disposed in a first one of the processing vessels and a second position in which the support is disposed in a second one of the processing vessels. An inter-module robot is positioned within the enclosure and is moveable between a first position adjacent to a first one of the modules and a second position adjacent to a second one of the modules.

30 Claims, 23 Drawing Sheets

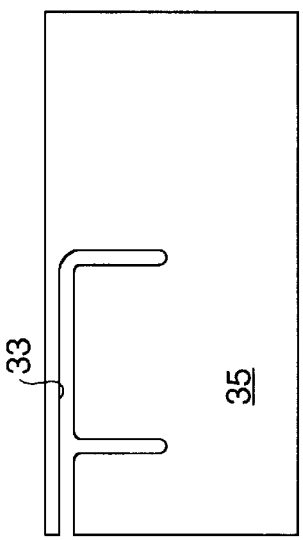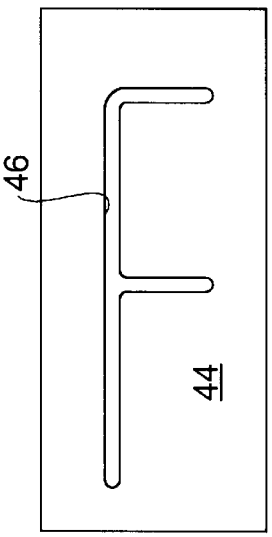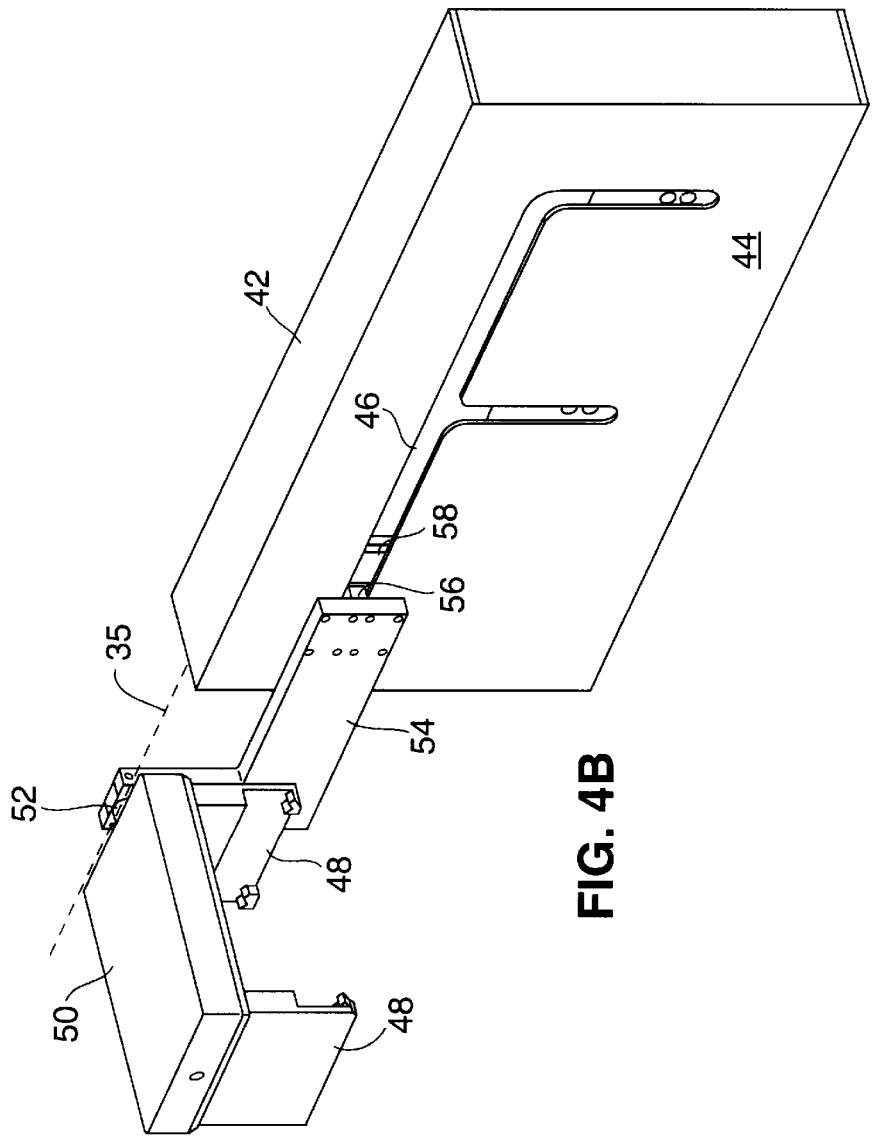

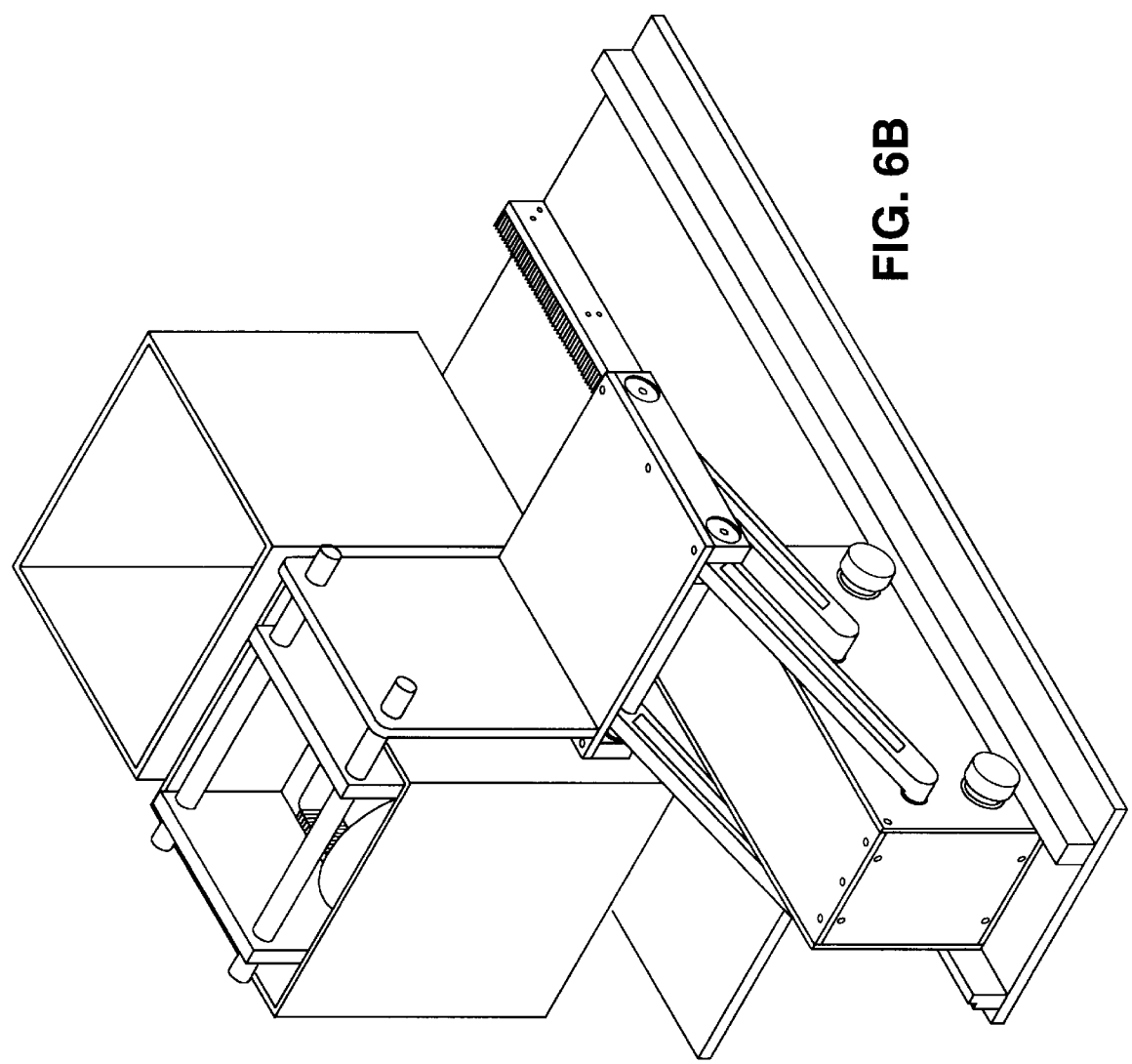

MULTIPLE STAGE WET PROCESSING PLATFORM AND METHOD OF USE

This application claims the benefit of U.S. Provisional Application No. 60/007,005, filed Mar, 6, 1998, and U.S. Provisional Application No. 60/103,648, filed Oct. 9, 1998.

FIELD OF THE INVENTION

The present invention relates generally to the field of devices and methods for treating the surfaces of objects. More particularly, the invention relates to the field of wet processing tools and methods used to treat objects such as semiconductor wafer substrates and other objects requiring treatment using chemicals to achieve a high level of cleanliness.

BACKGROUND OF THE INVENTION

In the fabrication of semiconductor wafers, multiple cleaning steps are required to remove impurities from the surface of the wafer prior to subsequent processing. The cleaning of a wafer, known as surface preparation, has for years been performed by collecting multiple wafers into a batch and sequentially placing this batch of wafers through a sequence of chemical and rinse steps with the final step being a drying step. Currently, there are several methods used to perform this surface preparation process.

The method that is most prevalent in conventional cleaning applications is the immersion wet cleaning platform, or "wet bench". In this process, a batch of wafers is dipped into a series of tanks, where certain tanks contain chemicals that are needed for clean or etch functions, while others contain deionized water for the rinsing of these chemicals from the wafer surface. Megasonic energy may be imparted to the wafers using piezoelectric transducers coupled to one or more of the cleaning tanks in order to thoroughly clean the wafer surfaces. The final tank is a dryer for the removal of deionized water from the wafer surface. The number of tanks determines what surface preparation processes are available and how many batches of wafers can be processed within the wet bench system at any one time.

One shortcoming of conventional wet benches is that the tanks, and thus the chemicals inside, are exposed to the environment. This allows fumes from the tanks and from wafers being lifted from the tanks to migrate to the environment surrounding the tanks, where they may pose environmental hazards. Safety lids have been added to some wet bench tanks in order to isolate each tank from the environment. However these lids have reduced the flexibility of these systems as well as the wafer throughput, and they do not entirely eliminate migration of fumes from wafers as the wafers are moved between the tanks. Wet bench systems also typically have large footprint requirements and thus increase cost of ownership by requiring extensive space in the fabrication facility.

A second method is single chamber cleaning, as disclosed in U.S. Pat. No. 4,911,761. During this process, a batch of wafers is placed into a single closed vessel. Process fluids flow sequentially through the vessel. For each chemical treatment carried out in the vessel, a volume of chemical reagent is delivered through the vessel followed by a volume of rinse fluid (e.g., deionized water (DI) or isopropyl alcohol (IPA)). During cleaning steps utilizing this method, megasonic energy may be imparted to the wafers using piezoelectric transducers positioned to direct megasonic energy into fluids in the tank.

Although the closed vessel utilized in this method is advantageous in that it has a relatively small footprint and it minimizes migration of fumes to the surrounding environment, the plug flow method has a number of drawbacks. For example, etch performance in a plug flow system relies primarily on complex fluid dynamics within the vessel. These systems also require high chemical use, because the necessary chemical reagents can only be used for a single wafer batch and cannot be recirculated and filtered. Additionally, the plug flow method requires rinsing of chemical reagent from the wafer and chamber surfaces, as compared to the need only to rinse the wafer and cassette surface areas present using conventional cleaning methods. Drying performance using the plug flow method may also be compromised due to the absorption of chemical contaminates into the plastic vessel and the subsequent leaching of these contaminates out of the plastic vessel during the drying steps.

A third cleaning technology is the spray processor or "acid processor" technique. A spray processor includes a carousel which carries batches of wafers and which spins within a chamber. Spray nozzles are oriented around the carousel and direct chemicals onto the wafers. This process relies on centrifugal effects to treat and dry the wafers. One limitation of the spray processor technology is that sonic energy cannot be imparted through the spray onto the wafers; therefore, particle removal is achieved only through etching and centrifugal forces imparted to the particles on the surface of the wafer. Moreover, chemicals used in this process cannot be recirculated and reused, resulting in high chemical use. Finally, the method's reliance on centrifugal forces, leads to frequent to water spotting on the wafers, and the moving parts of the carousel can lead to particle generation and build-up of electrostatic charge, all of which can result in wafer contamination or damage.

It is therefore desirable to have a new surface preparation apparatus and method which occupies a relatively small amount of fabrication facility space by having a small footprint, which substantially prevents fume migration to the environment surrounding the apparatus, and which allows reuse of processing chemicals all while optimizing the level of cleanliness achieved with the apparatus and method.

SUMMARY OF THE INVENTION

A multiple stage wet processing platform includes a sealable enclosure, at least two processing modules positioned within the enclosure, at least one of them including housing having an opening and a door moveable into position covering the opening, at least two processing vessels within the housing, and an intra-module robot within the housing and including a wafer support member, the intra-module robot moveable to a first position in which the support is disposed in a first one of the processing vessels and a second position in which the support is disposed in a second one of the processing vessels. An inter-module robot is positioned within the enclosure and is moveable between a first position adjacent to a first one of the modules and a second position adjacent to a second one of the modules.

BRIEF DESCRIPTION OF THE DRAWINGS

FIG. 4B is a side perspective view of the automation housing of the process module of FIG. 2, showing the arrangement of the end effectors and associated components relative to the automation housing.

FIG. 4C is an elevation view of an interior side wall of the module of FIG. 2.

FIG. 4D is an elevation view of a side wall of the automation housing of FIG. 4B.

FIG. 6B is a perspective view of the alternative module automation system of FIG. 6A, showing the position of the cassette and end effectors after the module automation has lowered them into a process vessel.

DETAILED DESCRIPTION OF THE DRAWINGS

A multiple stage wet processing platform has been developed for processing material requiring chemical treatment in a safe and clean environment. The platform and method of use according to the present invention will be described in the context of surface preparation for semiconductor wafer substrates. This is done for purposes of illustration only and is not intended in a limiting sense. The platform and method of the present invention are equally suitable for use in chemically treating and/or rinsing other objects for which a clean process environment is desirable. Examples of such other objects include, but are not limited to flat panel displays, optical and magnetic recording disks, and photomasks.

Figure 13A:
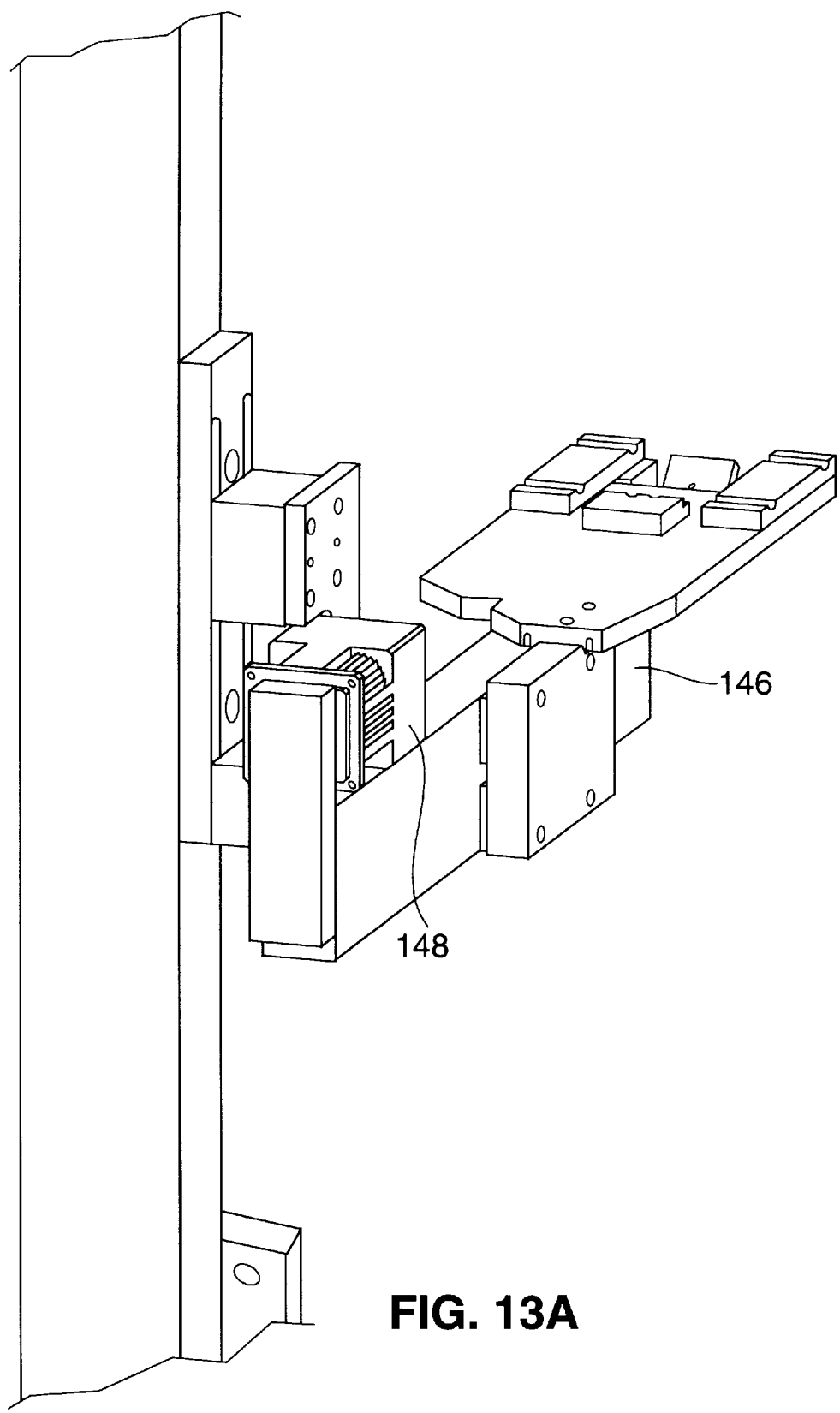
FIG. 13A is a perspective view of the pod grabber and rail of the buffer robot, illustrating the pod grabber in a retracted position.
Figure 13B:
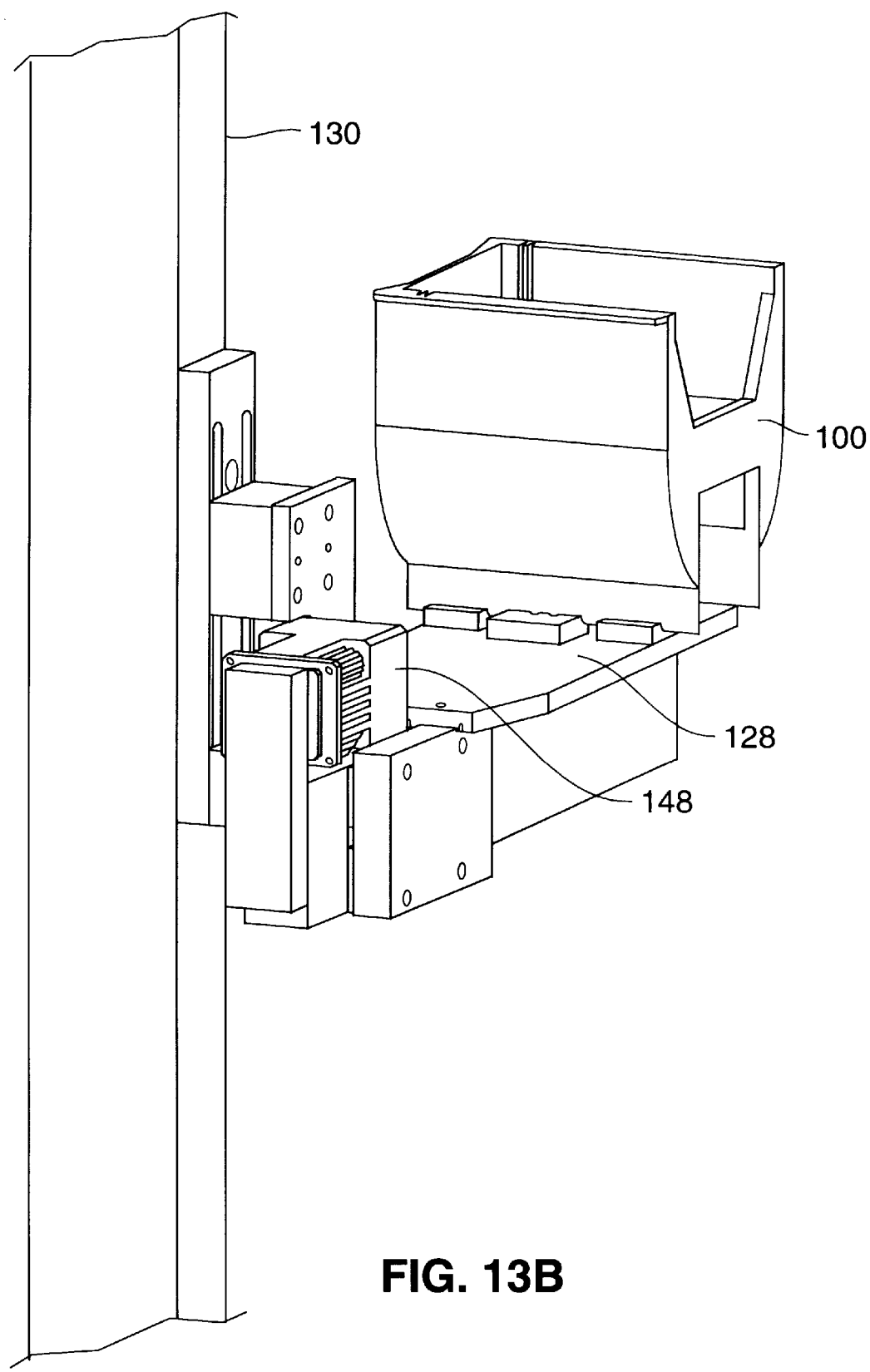
FIG. 13B is a perspective view similar to FIG. 13A showing the pod grabber in an extended position and further showing a wafer boat or pod engaged by the grabber.

Generally speaking, platform 10 is comprised of an enclosed housing 12 in which one or more processing chambers or modules 14 are mounted. A sealable input/output port 13 is provided for introduction of product (e.g. wafers) into, and removal of product from, platform 10. Typically, wafers to be processed are contained within a wafer boat 100 (which may be of the type commonly used for wafer storage and transfer, see for example FIG. 13B) as they are moved into and out of the platform 10 via port 13.

Figure 1A:
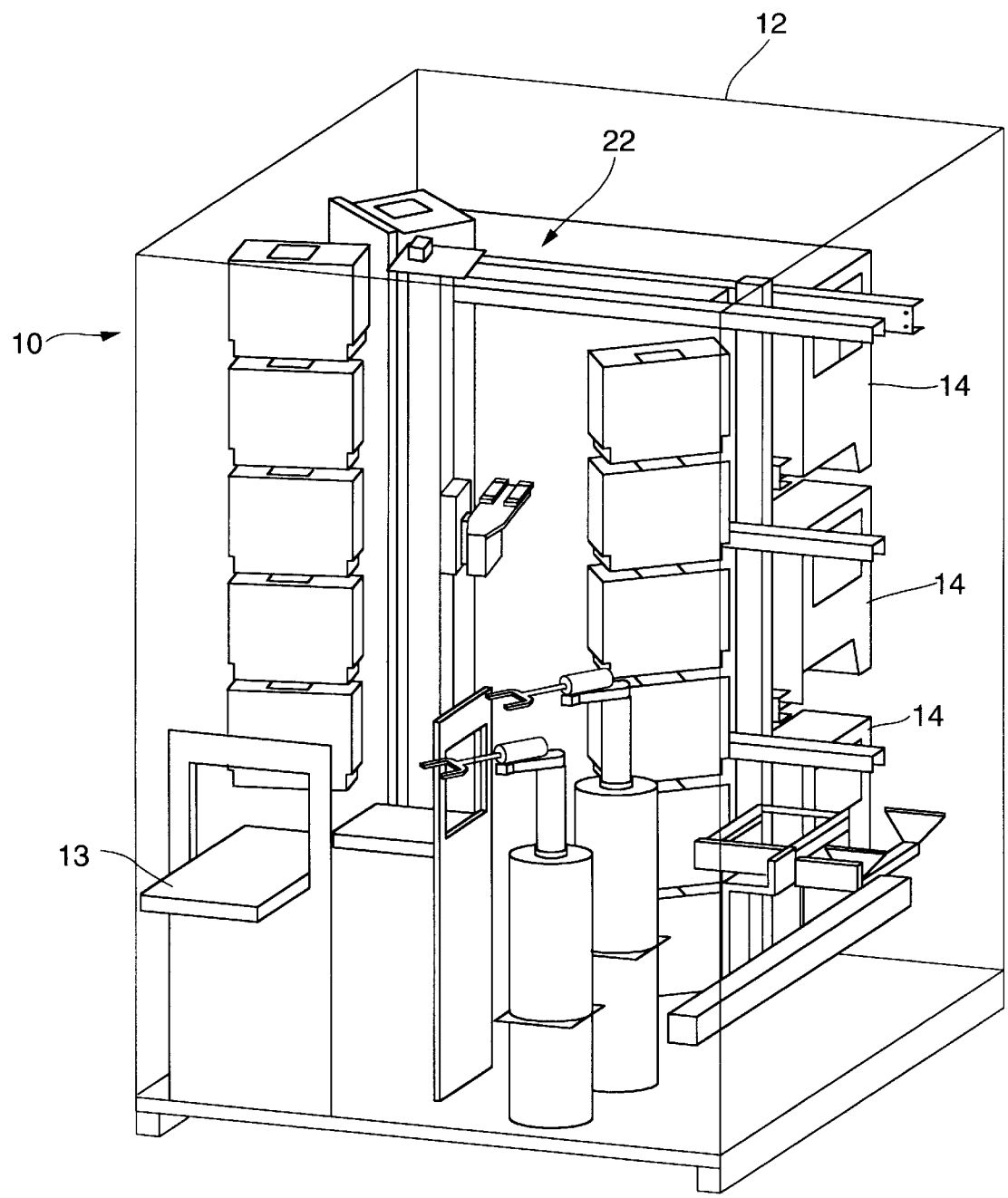
FIG. 1A is a front perspective view of a multiple stage wet processing platform.

Each process module 14 houses process tanks 16 (FIG. 2) into which product is immersed for processing. Intra-module robotics 18 moveable within the modules move product between the tanks in the module. Inter-module robotics 20 (FIG. 1) are external to the process modules and function to move product between modules 14. The platform may also include a buffer stocker system 22 that serves to store reserves of wafers (preferably in wafer boats) within the platform's enclosure for subsequent processing. A wafer transfer system removes wafers from the boats 100 and onto a process cassette 200, and transfer the cassette and wafers to and from the inter-module robotics 20. In the following description, these components and automation systems will be described with respect to their use in carrying out the following steps:

Moving boats 100 from port 13 into buffer stocker storage system 22, that serves to store a supply of product within the platform 10 for subsequent processing;

Moving boats 100 from port 13 and/or from buffer stocker system 22 to a wafer transfer station;

Transferring wafers, either individually or in batches, from the boats onto a process cassette which supports the wafers throughout wet processing;

Using intermodule automation 20 to move the cassettes between various ones of the process modules as needed to perform a process recipe;

Using intra-module automation 18 to move the cassettes into and out of the process vessels within the process modules in accordance with the process recipe;

After processing, returning the cassettes to the wafer transfer station, at which point the wafers are unloaded in batches or individually into a wafer boat 100;

Moving the wafer boat from the wafer transfer station to the buffer stocker system 22 and/or out of the platform via port 13.

A process controller 300 is electronically coupled to the automation systems, chemical dispensing systems etc. utilized in the modules 14, and the various valves and sensors associated with operation of the system. Controller 300 is programmed to govern control and timing of these components to activate the automation systems, dispense chemicals, automatically open and close the valves, activate doors and lids and regulate flow of fluids and gases etc. in accordance with process recipes and platform schedules appropriate for the treatment process(es) being carried out.

A controller suitable for this purpose is a MCS microprocessor controller available from Preco Electronics, Inc. Boise, Id. However, any suitable process control computer can be used. It should be noted that the electronic coupling between the controller and associated components is not represented in the drawings only for reasons of clarity.

In the following description, the platform components will be described in a "back to front" order. In other words, the process modules 14 and their components will be described first. Next, the inter-module automation 20 used to move cassettes of wafers between process modules will be described. Then the description will focus on the wafer transfer automation used to transfer wafers from boats onto a cassette and for carrying cassettes for retrieval by the inter-module automation 20. Finally, the automation used to introduce boats of wafers into the platform, to store them in the buffer stocker system, and to deliver them to the wafer transfer system will be described. Other aspects of the platform which are not outlined here will also be addressed in the following description.

Process Modules

The processing steps carried out on wafers within the platform are performed within one or more process modules 14, each of which is used to carry out a piece of the overall wet process, and each of which contains its own automation for moving wafers within the module interior. Modules 14 may be arranged vertically relative to each other, as shown in the drawings. This arrangement is beneficial in that it minimizes the use of valuable fab floor space. Other arrangements are equally feasible and beneficial. For example, the modules may be arranged linearly and serviced by inter-module automation that moves side to side between the modules. As another example, the modules may at least partially surround an inter-module automation system that rotates to gain access to each module.

Modules used in the platform may take a variety of forms without departing from the scope of the present invention. Various modules that may be utilized for this purpose are shown and described in published International Application PCT/US98/02951, entitled MULTIPLE STAGE WET PROCESSING CHAMBER, which is incorporated herein by reference for all purposes.

Figure 2:
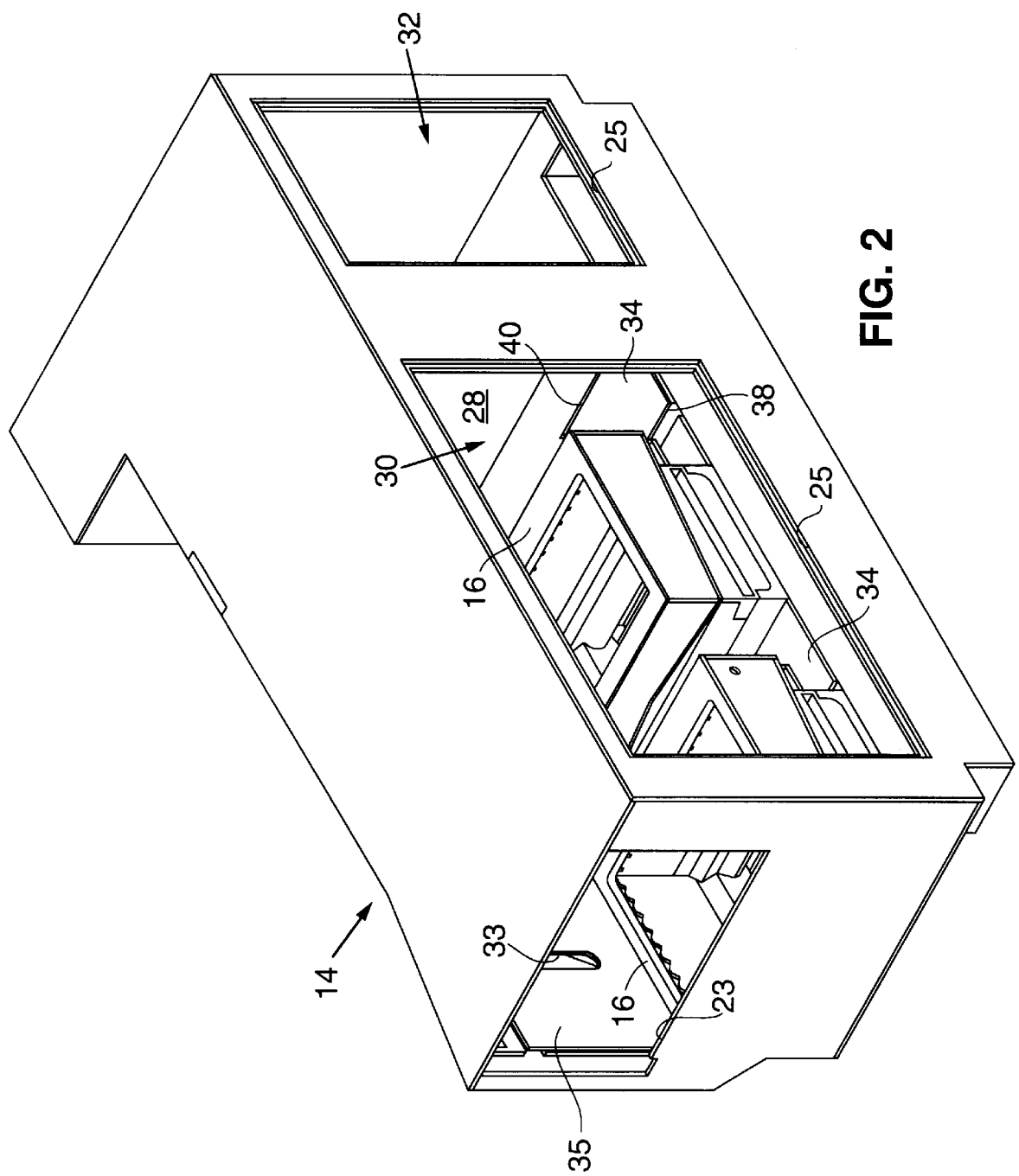
FIG. 2 is a perspective view of a process module of a type utilized in the platform of FIG. 1A. For clarity, the door is not shown and service panels are removed to permit visualization of the module interior.
Figure 3:
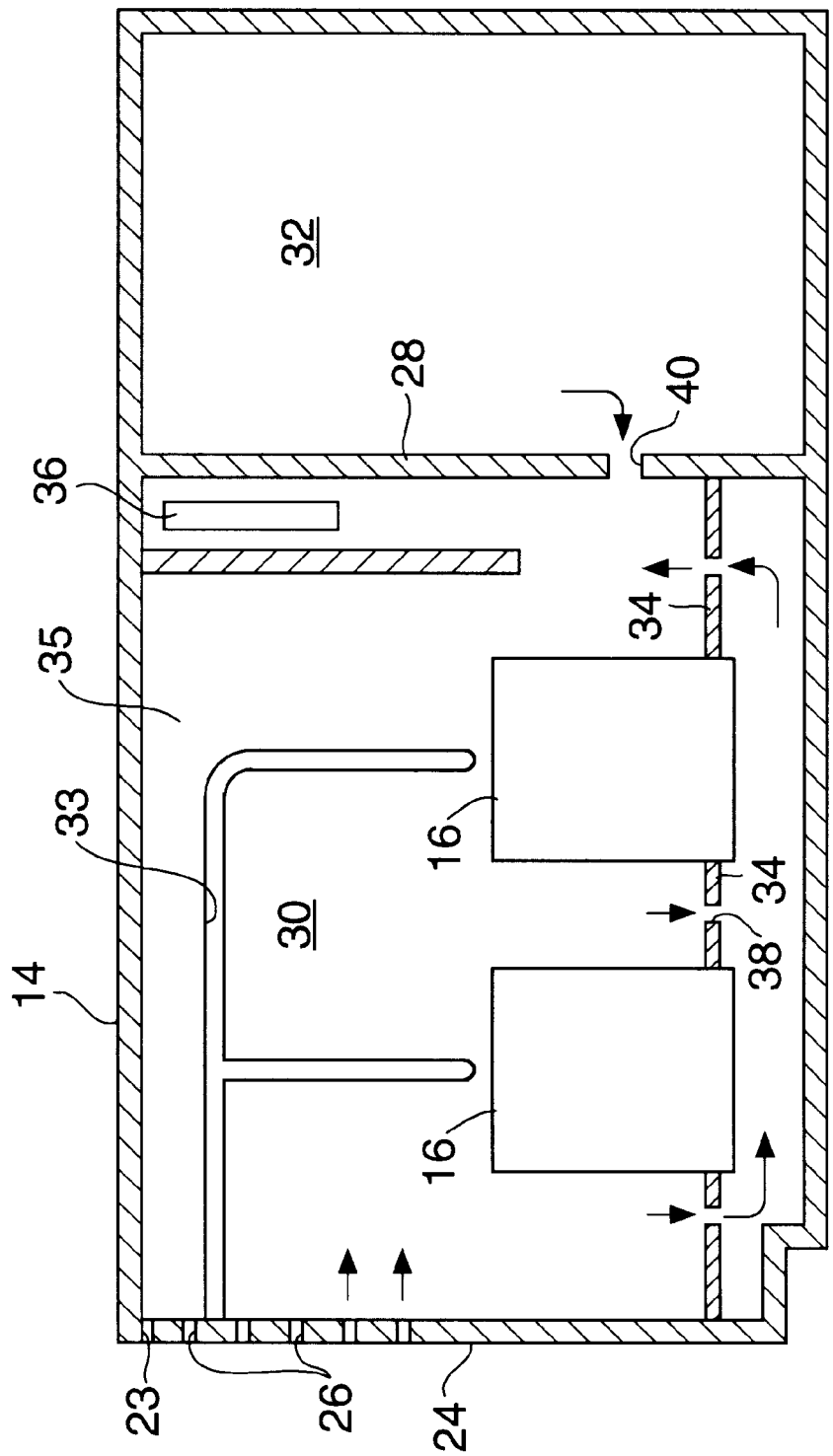
FIG. 3 is a cross-sectional side view of the process module of FIG. 2.

Process modules 14 found particularly useful in the platform 10 are shown in FIGS. 2 and 3. Each process module 14 is an enclosed chamber including an opening 23. A door 24 (FIG. 3 only) covers opening 23 and is provided with conventional robotics (not shown) for automatically opening and closing door 24 to permit wafers on wafer cassettes to be moved into and out of the module. Door 24 may include a plurality of small ventilation openings 26. Removable access panels (not shown) cover service openings 25, allowing convenient access to the module interior for service and maintenance. FIG. 2 shows the module with the panels removed, so as to permit visualization of the module interior.

Process tanks 16 are disposed within each module 14 as needed for the particular process to be carried out. Any conventional wet process tanks may be utilized, although tanks of the type described in U.S. Application entitled PROCESS VESSEL, filed Mar. 5, 1999, Krawzak et al, Attorney Docket: SCP 4300, have been found to be particularly useful in the platform.

In a preferred embodiment, each module 14 is a "self-terminating" module. This means that within each module is a process tank or combination of process tanks that, when used according to a selected recipe, neutralize the product and the module's interior environment before door 24 is opened for removal of the product from the module. Use of self-terminating modules is highly beneficial in that it minimizes release of chemical vapors into the platform environment and thus into the surrounding air. As discussed in greater detail below, examples of self-terminating modules include an organic or heated acid module, an etch module, and a passivation module in which the wafer surface is passivated and dried. As a further measure against migration of fumes into the platform environment, it is desirable to arrange the tanks within the modules such that whichever of the tanks is used for fume-generating chemicals (e.g. sulfuric) is positioned furthest from opening 23.

Referring to FIG. 3, dividing wall 28 separates module 14 into a process section 30 and a rear section 32. Process tanks 16 are mounted to a stage 34 in process section 30. A slot pattern 33 is formed into sidewall 35 of process section 30. Slot pattern 33 includes a horizontal section and a pair of vertical sections extending downwardly towards tanks 16. As best shown in FIG. 4C, the horizontal section of the slot pattern 33 extends to the end of the wall 35 at door 24 (door shown in FIG. 3).

The module's rear section 32 houses plumbing (not shown) needed to move process fluids to and from the tanks. A chemical injection system useful for dispensing process fluids into the tanks is shown and described in U.S. application Ser. No. 09/227,226, filed Jan. 8, 1999, Butler et al, Attorney Docket SCP 4710, which is incorporated herein by reference for all purposes.

A vent 36 is formed in a wall of process section 30 and is coupled to an exhaust duct (not shown) that operates off of the draw of the fabrication facility's ("fab's") ventilation system. It is desirable to configure module 14 to promote airflow through the module and out vent 36 in a manner that prevents accumulation of vapor clouds that can escape when door 24 is opened and/or condense on the module's walls. During use of the platform, the draw through vent 36 results in airflow into each module via openings 26 and into the vent 36. Slots 38 and 40 in stage 34 and dividing wall 28, respectively, encourage airflow beneath stage 34 and from behind wall 28, also towards vent 36. Arrows in FIG. 3 illustrate airflow within module 14.

In some instances, e.g. during processing using heated chemical such as hot sulfuric with a module, higher velocity airflow may be desired to promote cooling within the module. Thus, a conventional damper may be utilized in connection with the vent 36 to control velocity of airflow through the module. The damper may also be utilized to maintain the velocity of the airflow when changing conditions in the module would alter airflow velocity. One such change in conditions results when door 24 is opened, causing airflow velocity to fall due to the increased area of the opening through which air enters the module. Maintaining adequate airflow velocity when the door is opened is desirable for minimizing fume migration out of the module during movement of product through the door.

Figure 4A:
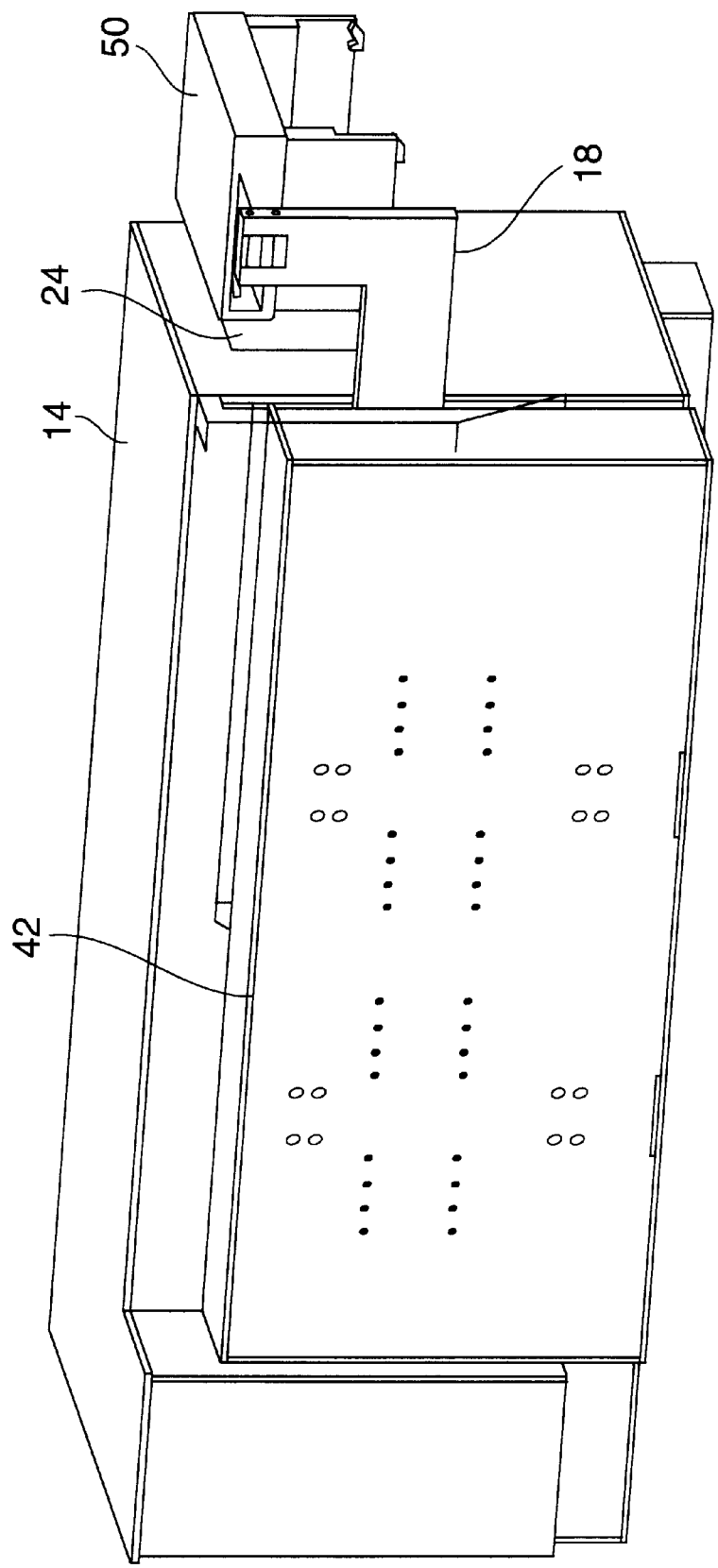
FIG. 4A is a side perspective view of the process module of FIG. 2, showing the end effectors of the module automation extended through the opened door of the module.

Referring to FIG. 4A, an automation housing 42 is mounted to a side panel of module 14. Automation housing contains the automation needed for the intra-module automation system 18 (also referred to herein as "module automation"), which is used to retrieve cassettes of wafers from inter-module elevator 20 (FIG. 1B), and to move cassettes of wafers into and between process tanks 16.

Housing 42 is an enclosed box having a side wall 44 positioned facing module 14. Wall 44 has a slot pattern 46 that includes a horizontal slot and two vertical slots extending from it. When housing 42 is mounted to chamber 14, side wall 44 is parallel to module wall 35 and spaced from it by a small distance (see FIG. 4E). It will be appreciated from a comparison of FIGS. 4C and 4D that slot pattern 33 on module wall 35 and slot pattern 46 on the wall 46 of robotics enclosure that the slots are offset from one another. As will explained in detail in the following section, the slots 33, 35 are important to the operation of the module automation.

Intra-module Automation

FIGS. 4A through 4F illustrate a module automation system 18 of a type that may be used in each of the modules 14. Module automation system 18 preferably functions to reach through opening 23 in module 14 to retrieve product from inter-module elevator 20 (FIG. 1), and to move product into and between tanks 16 as needed for a process recipe.

Referring to FIGS. 4A and 4B, IMA 18 includes end effectors 48 configured to support a cassette of wafers. A lid 50 extends between end effectors 48. During use of the IMA, end effectors 48 support a cassette (FIG. 4G) and are made to lower the cassette into a process tanks 16 (FIG. 3). Lowering the cassette into a tank 16 results in the lid 50 making sealing contact with the top of the tank 16, thus containing any fumes generated during processing in the tank 16.

Figure 4E:
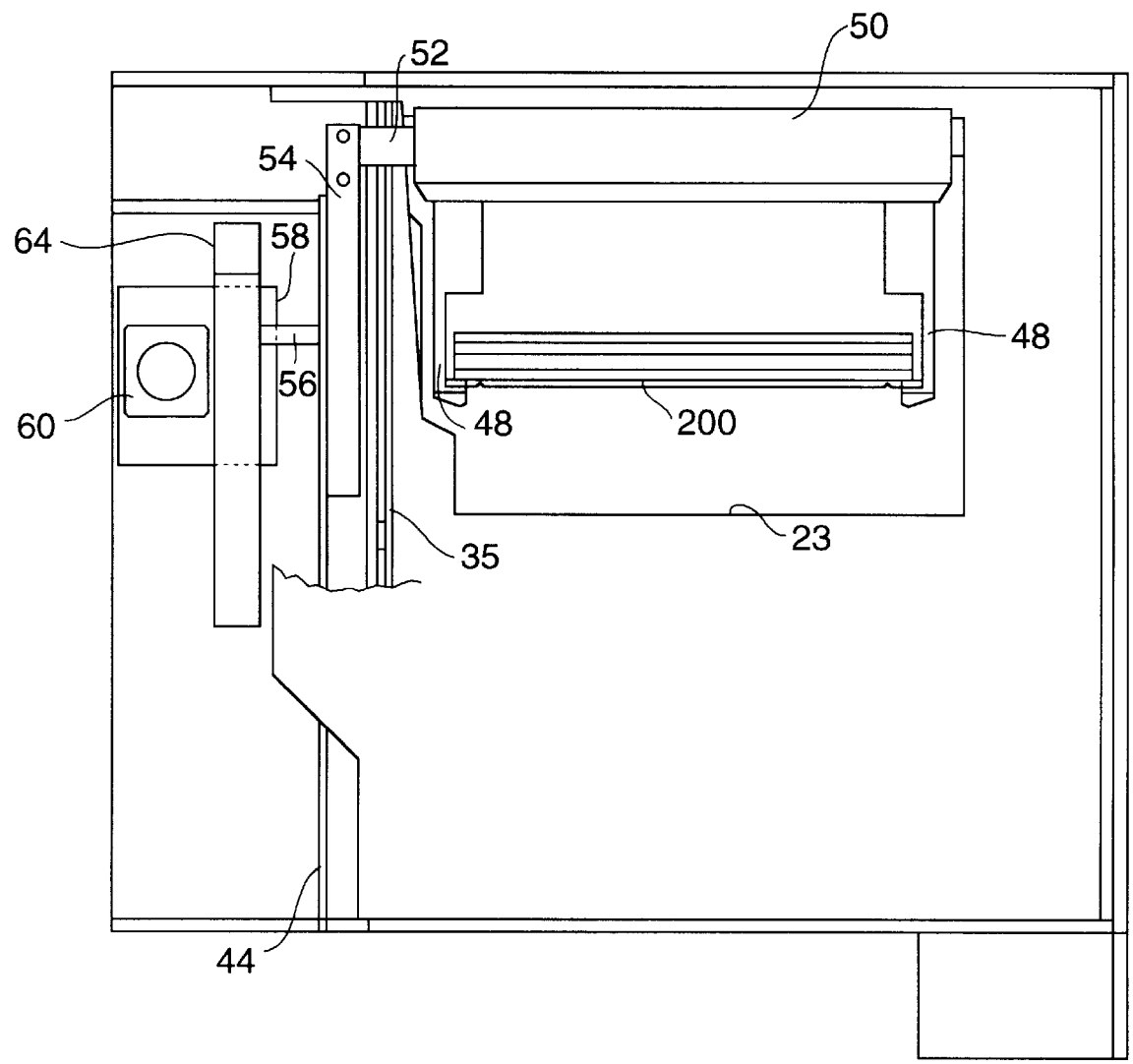
FIG. 4E is a front elevation view of the module of FIG. 2, showing a portion of the module in cross-section to permit visualization of the module automation.

Referring to FIGS. 4B and 4E, bar 52 extends from lid 50 and is supported by L-shaped arm 54. A second bar 56 extends between L-shaped arm 54 and a carriage 58. L-shaped arm 54 is positioned between chamber wall 35 and automation housing wall 44. Bar 52 extends through slot system 33 in chamber wall 35, and bar 56 (which is parallel to bar 52) extends through slot system 46 in automation housing wall 44. Dashed line labeled 35 in FIG. 4B represents the plane of wall 35.

Figure 4F:
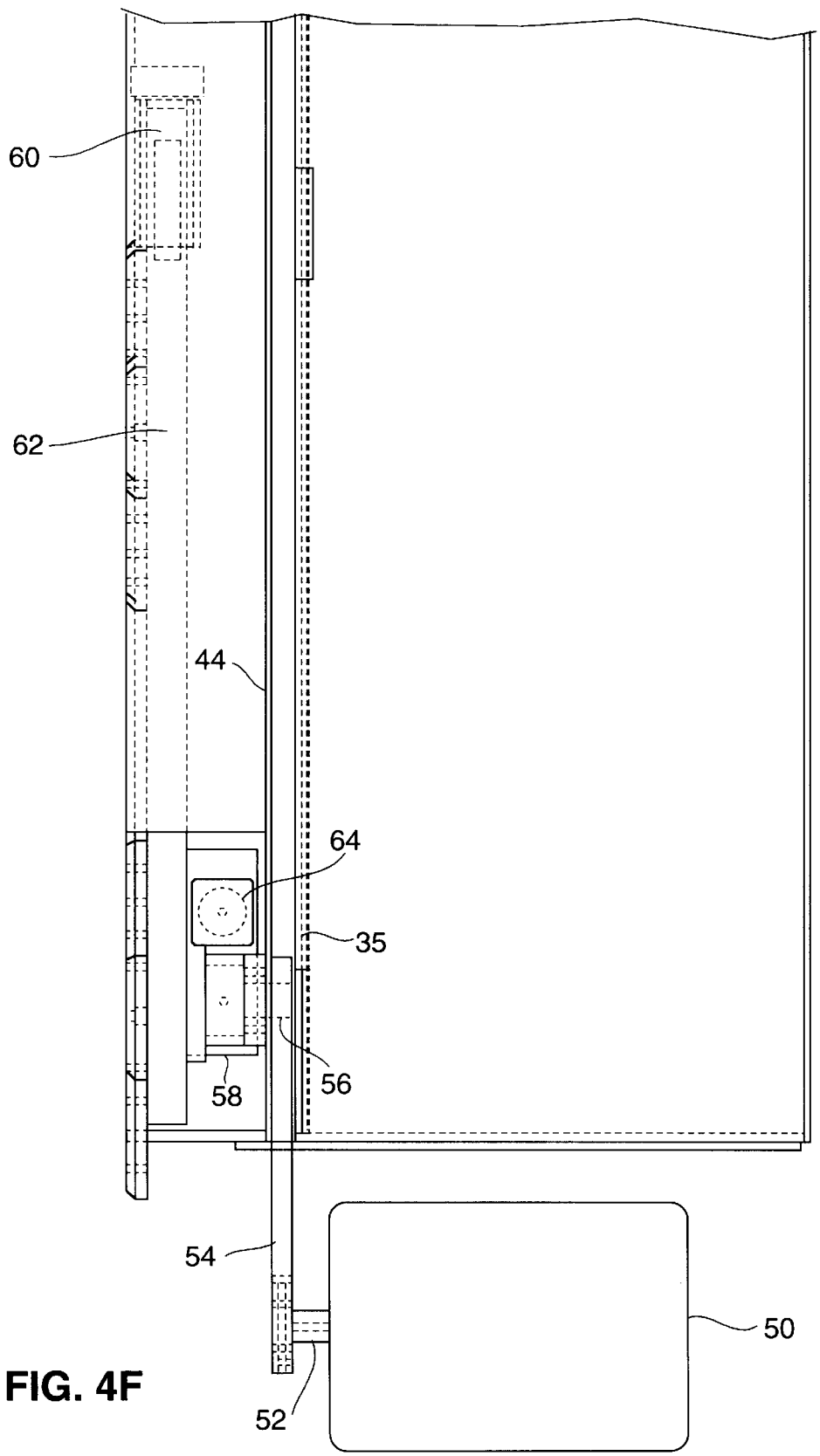
FIG. 4F is a top plan view of the module of FIG. 2.
Figure 4G:
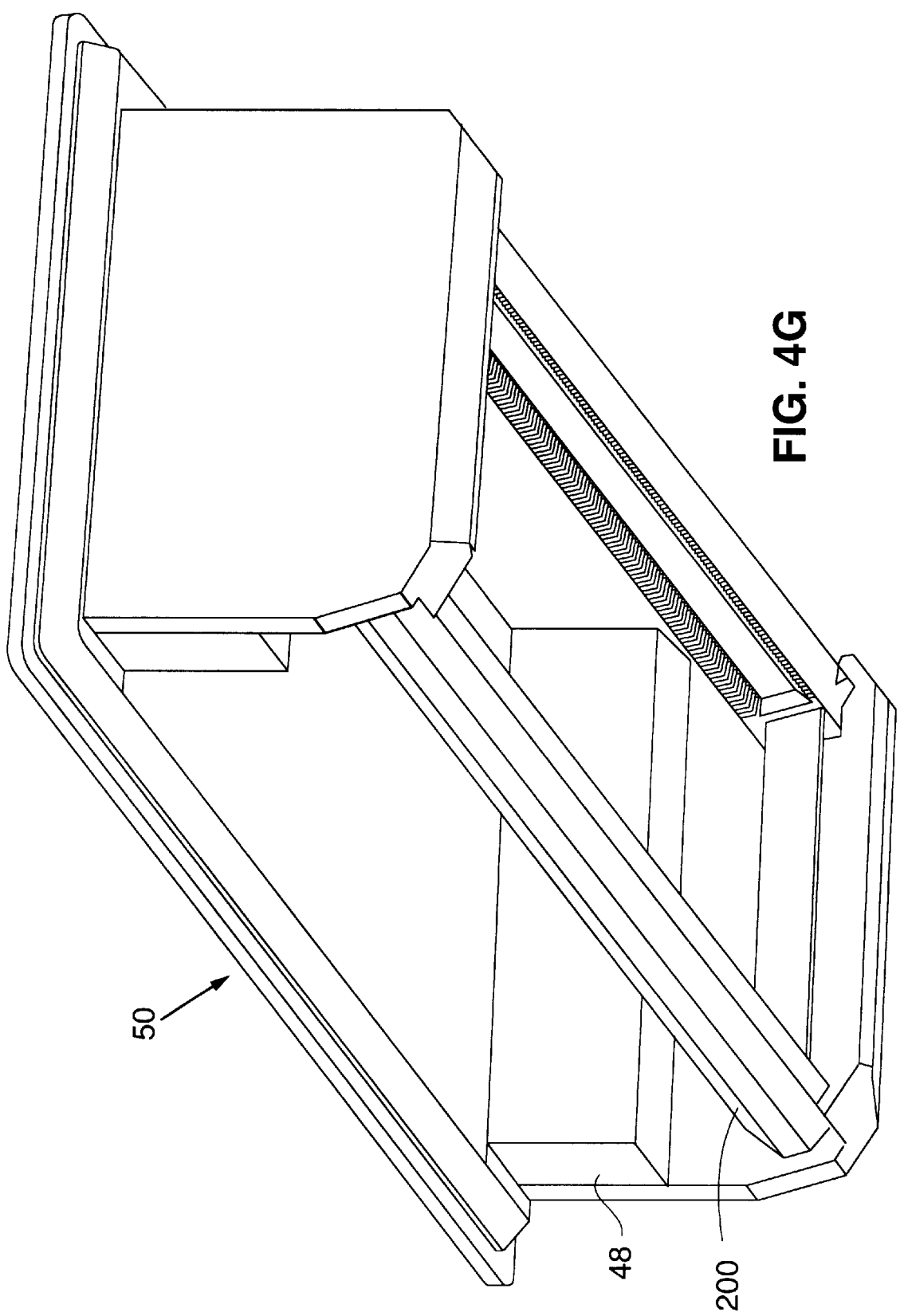
FIG. 4G is a perspective view showing the end effectors associated with the module automation of FIG. 4E engaged with a wafer cassette.

Carriage 58 is moveable in a horizontal direction by motor 60, which causes movement of carriage along a rod 62 (FIG. 4F). A second motor 64 and rod 66 are carried by carriage 58 and effect vertical movement of carriage. Motors 60, 64 and their associated moving parts are isolated within housing 42. This protects the components from moisture and fumes, and also minimizes migration of particles generated by the robotics into the process region.

During use, movement of carriage 58 results in corresponding movement of end effectors 48 and lid 50. When carriage 58 is moved to the end of its horizontal travel at the input/output side of module 14, end effectors 48 and lid 50 extend out opening 23. When in this position, end effectors 48 retrieve a wafer cassette 200 from, or deliver one to, intermodule elevator 20 (FIGS. 4A and 4F). This is possible because of the open end of the horizontal portion of slot system 33.

Downward vertical movement of carriage is timed to occur when bars 52, 56 are positioned to descend the vertical sections of their corresponding slot systems 33, 46. Vertically downward movement results in movement of end effectors 48 into a process tank 16 positioned beneath vertical sections of slot 33. Upward vertical movement of carriage raises the end effectors from the tank.

Alternative Module Automation

Figure 5:
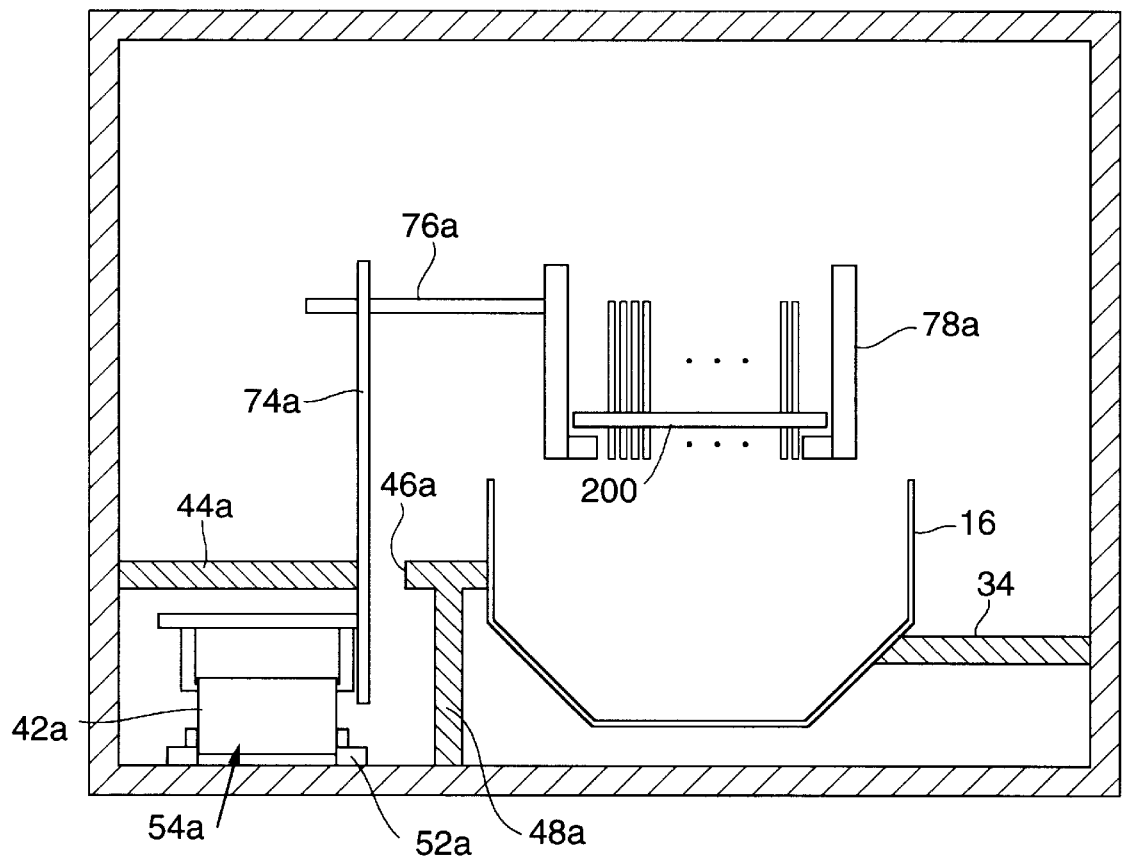
FIG. 5 is a cross-sectional front view of an alternative process module which may be used with the platform of FIG. 1A.

Referring to the cross-sectional end view of a modified module 14a shown in FIG. 5, an alternative robotics module may be provided for an alternative module automation system that may be housed fully within the module 14a. Robotics enclosure 42a extends longitudinally through the module and includes a horizontal plate 44a having an elongate slot 46a. Preferably, enclosure 42a is bounded by the module's walls and by an additional dividing wall 48a, so as to seal and isolate the robotic components from the process region 30 of the module. This protects the components from moisture and fumes, and also minimizes migration of particles generated by the robotics into the process region.

Figure 6A:
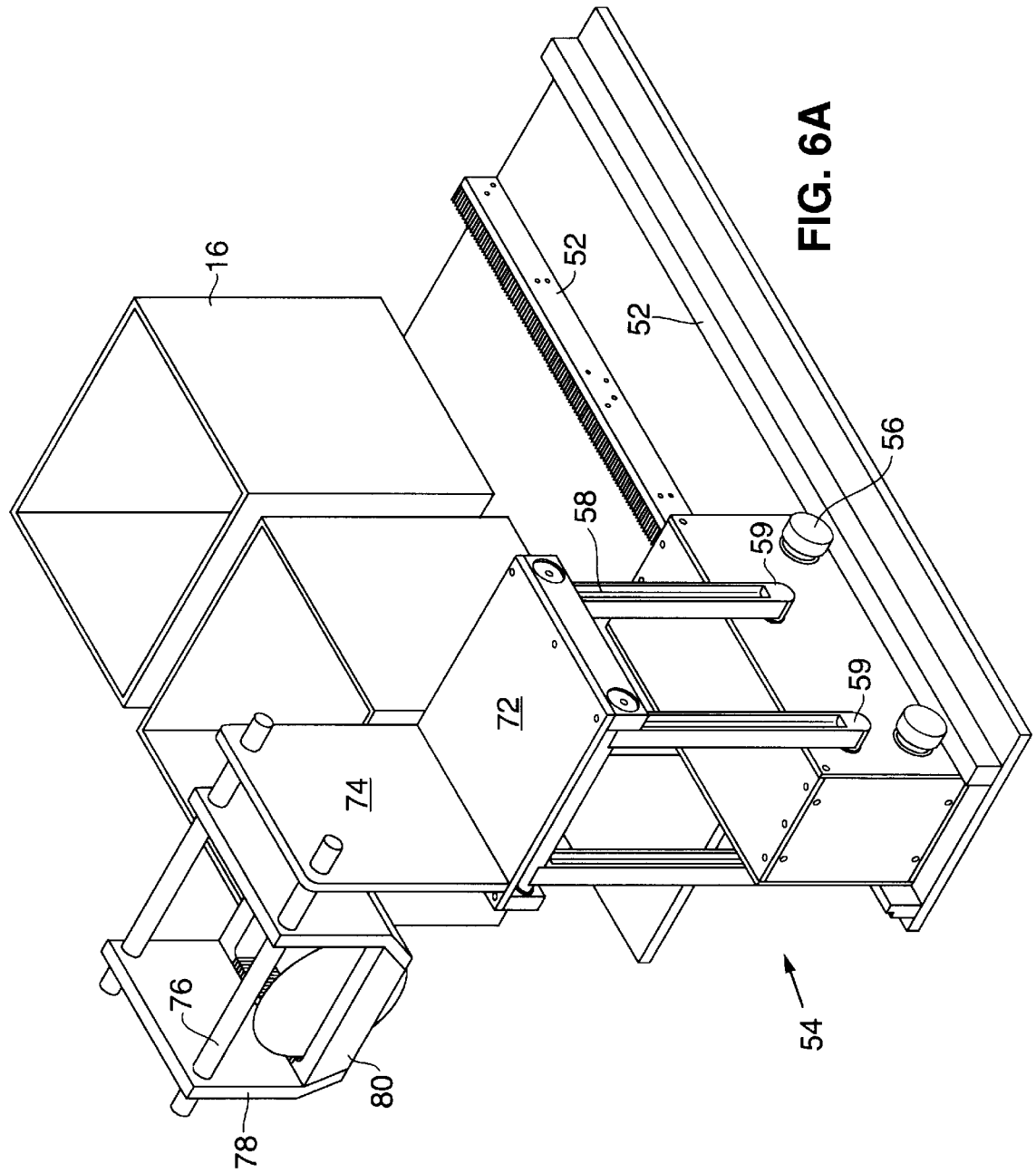
FIG. 6A is a perspective view of an alternative module automation system for use in the alternative module of FIG. 5. The drawing includes process vessels, but includes little of the module structure so that the automation and its relationship to the vessels can be easily seen.

Alternative module automation system 18a includes a horizontal drive track 52a mounted within alternative robotics enclosure 42a, beneath horizontal plate 44a (the enclosure and plate are shown in FIG. 5). Referring to FIG. 6A, a two-axis robot 54 is mounted on drive track 52a by drive gears 56a for movement along the length of the drive track. Output links 58a have ends 59a extending from two-axis robot 54a for pivotal movement about the ends 59a.

Figure 7:
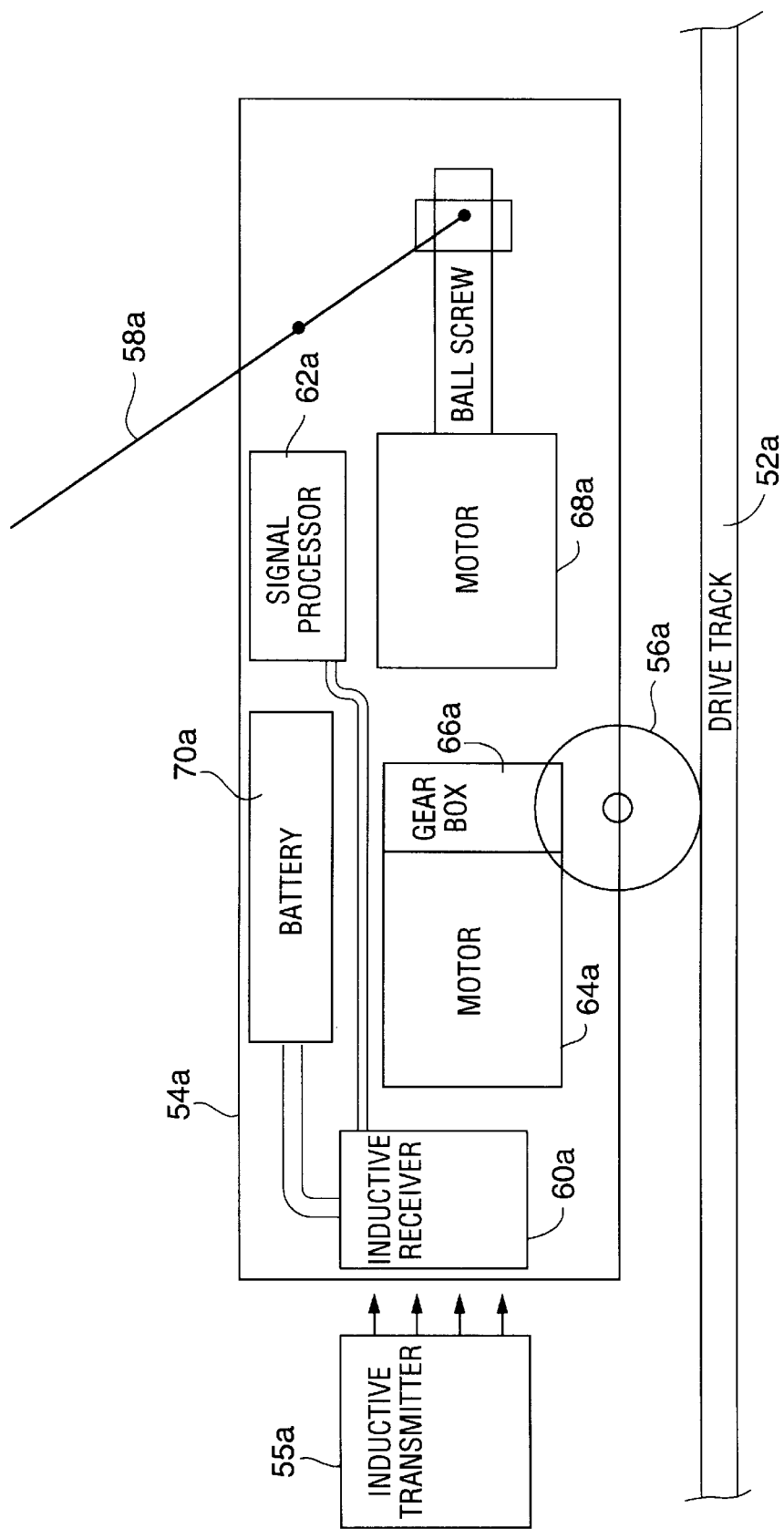
FIG. 7 is a cross-sectional side view of a two-axis robot utilized in connection with the module automation system of FIGS. 6A and 6B, in which the components of the robot are illustrated schematically.

Drive components of the alternative automation system 18a are schematically illustrated in FIG. 7. System 18a is comprised of robot 54a (which is a closed box with multiple components sealed inside) as well as an inductive transmitter 55a positioned remotely of the robot. Internal components of robot 54a include an inductive receiver inductively coupled to inductive transmitter 55a. A signal processor 62a is electronically coupled to inductive receiver 60a for receiving control signals directing movement of the robot 54a. A horizontal component of the robotic movement is effected by a first motor 64a and a gear box 66a coupling the motor to drive gears 56a.

When activated, first motor 64a moves robot 54a horizontally along drive track 52a. A second motor 68a rotates output links 58a to cause rotation of the links about their ends 59a. A battery 70a provides power to motors 60a, 64a. Inductive receiver 60a is coupled to the battery and enables remote charging of the battery using the inductive transmitter 55a.

Referring again to FIG. 6A, the free ends of output links 58a are coupled to a horizontal plate 72a and a vertical plate 74a. Rods 76a extend horizontally from vertical plate 74a and support end effectors 78a for receiving a wafer cassette 80a. As illustrated in figures FIGS. 6A and 6B, movement of the wafer cassette into, out of, and between process tanks 16 is accomplished through combined horizontal movement of robot 54a along drive tracks 52a and pivotal movement of output links 58. End effectors 78a may be extended through door opening 23 in module by moving robot 54a to the end of its longitudinal travel and pivoting links 58a through the opening 23a.

Referring again to FIG. 5, when the alternative IMA is installed into robotics enclosure 42a of module 14, its vertical plate 74a extends through slot 46a into process section 30 of the module 14 and supports end effectors 78a in the process section. An advantage of the alternative IMA 18a lies in the placement of many robotic components within the robot's sealed housing where they are isolated from chemicals that can corrode them. Because of the inductive transmitter/receiver arrangement, power cables need not be extended into the module 14, and inductive transmitter 55a may be positioned remotely from the robot 54a, such as outside the module 14, and thus away from the harsh environment within the module 14.

Inter-module Elevator

Figure 8A:
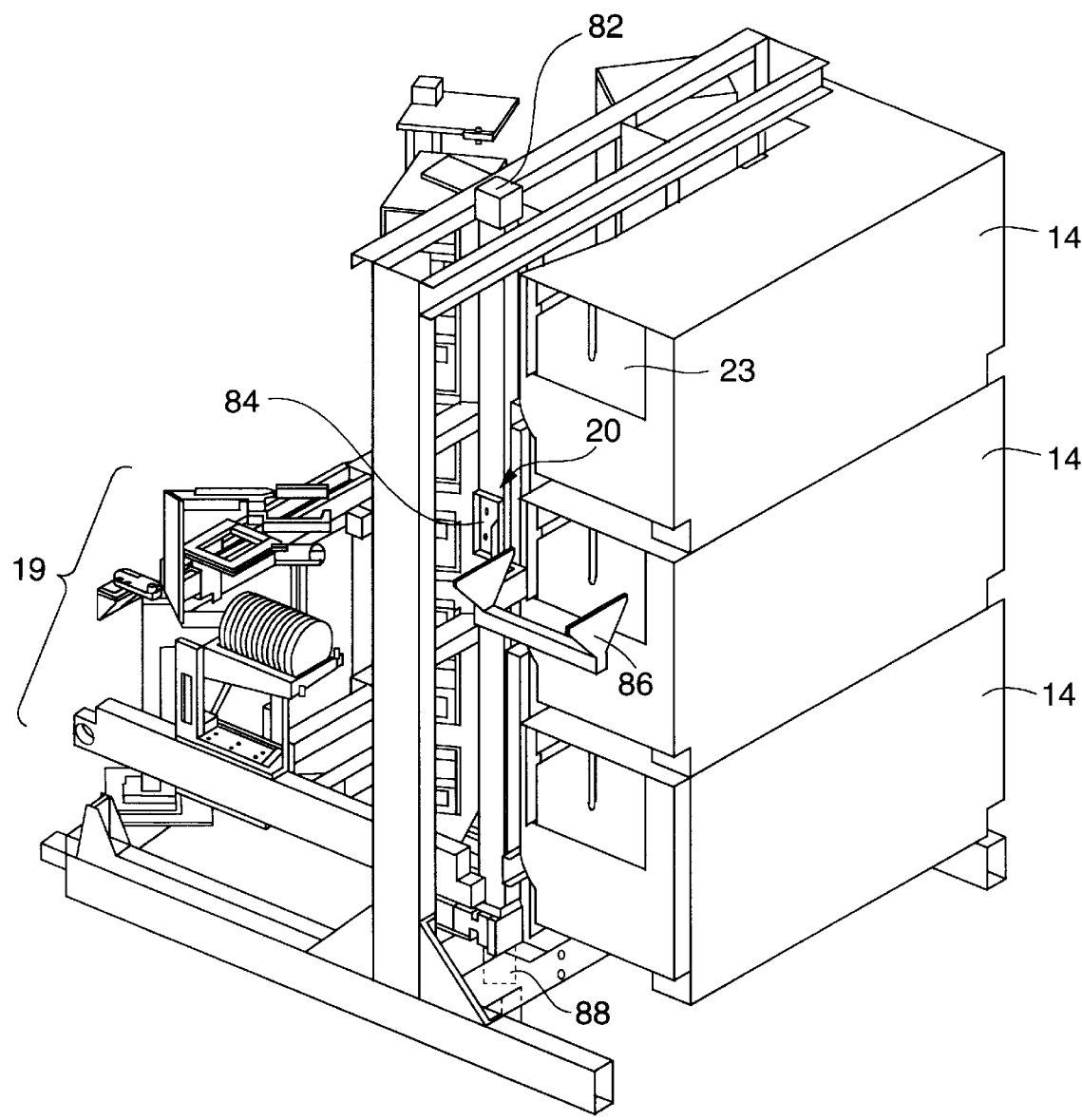
FIG. 8A is a rear perspective view of the platform of FIG. 1A, showing the platform equipped with a batch wafer transfer system.

Referring again to FIG. 8A, inter-module elevator 20 ("IME") functions to move wafers positioned on a wafer cassette from wafer transfer system 19 to modules 14 for processing.

IME 20 is a single axis robotic system which positions the product adjacent to opening 23 (FIG. 2) in one of the modules. When the product is positioned adjacent to the opening 23 in this manner, the IMA within the module extends end effectors 48 through opening 23, causing them to engage the wafer cassette as will be described below.

IME 20 includes a vertical track member 82 and a carriage 84 is slidably mounted to track member 82. Carriage 84 is connected to a support 86 for supporting a wafer cassette. Carriage 84 is coupled to a belt (not shown) driven by a motor 88 to move carriage 84 upwardly and downwardly along track member 82.

Figure 8B:
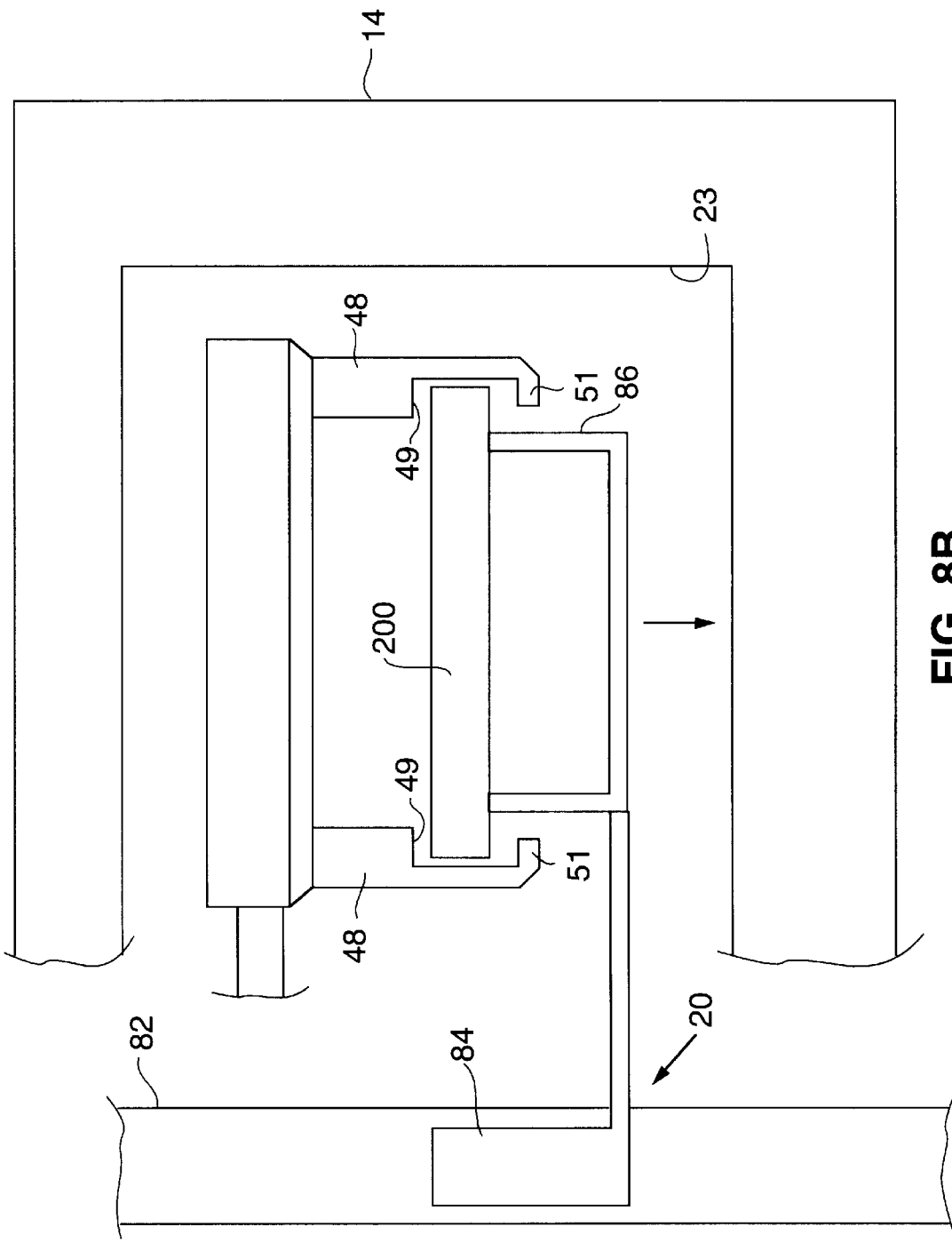
FIG. 8B is a front elevation view of the module similar to the view of FIG. 4E and further showing the cassette support of the inter-module elevator, illustrating the transfer of a cassette from the support to the end effectors.

FIG. 8B illustrates the manner in which a cassette 200 is transferred from support 86 of IME 20 to end effectors 48 of IMA 18. The hand-off begins with a wafer positioned on support 86 and positioned by the support 86 adjacent to opening 23 of the module into which the cassette is to be moved. Module robot 18 extends end effectors 48 out opening 23 in the manner described above, causing cutout sections 49 of the end effectors 49 to become positioned around cassette 200 as shown in FIG. 8B. Afterwards, elevator 20 moves downwardly by a small amount, thus allowing cassette 200 to rest on notched members 51 of end effectors 48.

Wafer Transfer System

Referring again to FIG. 1A, wafer transfer system 19 ("WTS") serves to transfer wafers, either individually or in batches, from a wafer boat onto a process cassette, and to move the process cassette onto the IME 20 described in the previous section.

Figure 9:
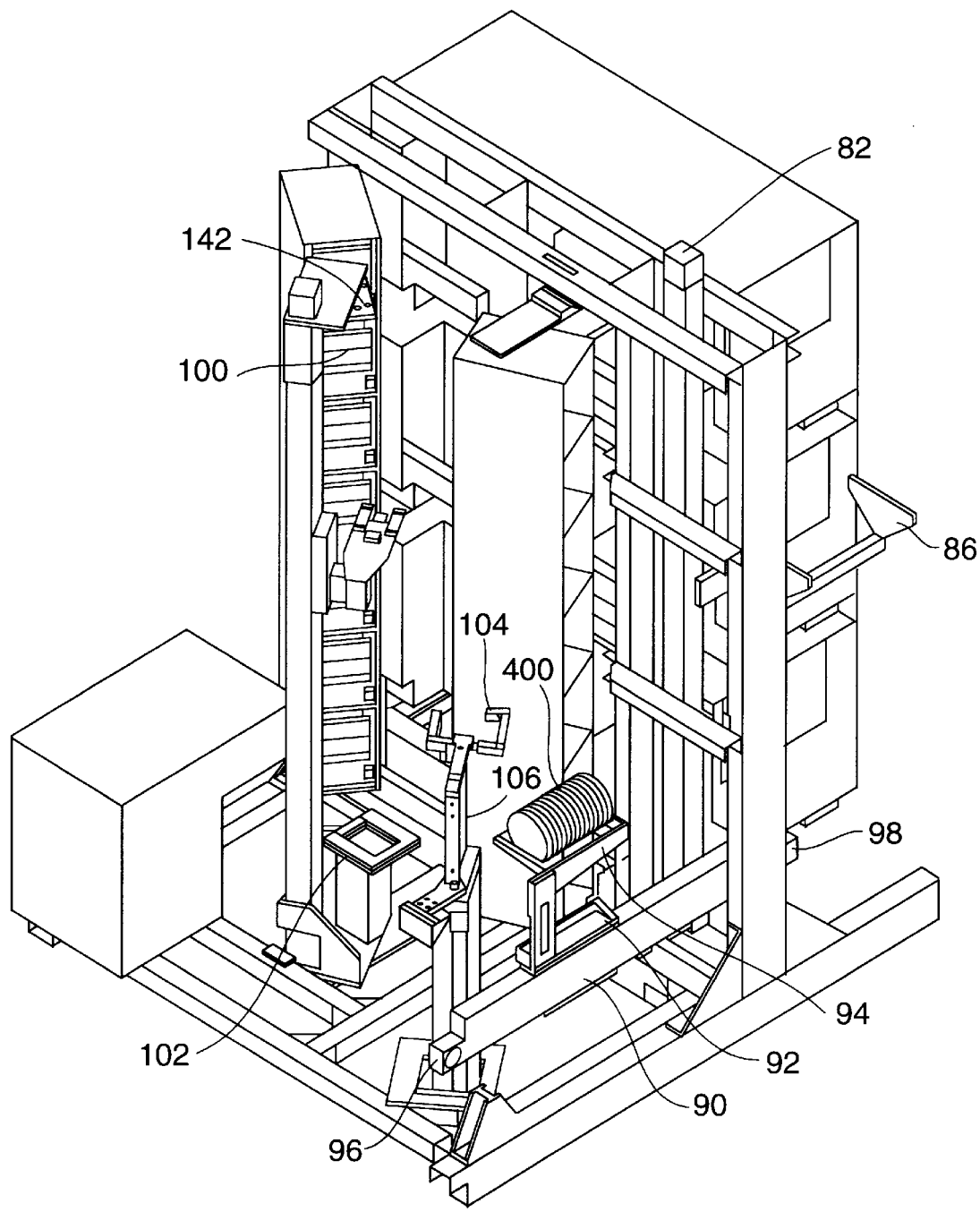
FIG. 9 is a front perspective view of an embodiment of the platform of FIG. 8A.

Referring to FIG. 9, the IME 20 receives a cassette 200 carrying wafers from a cassette transfer table that includes a horizontal rail 90, a belt driven carriage 92 and a cassette carrier 94 mounted to carriage 92. A motor 96 is coupled to carriage 92 by a drive belt (not shown). Activation of motor 96 causes horizontal movement of carrier 94 between a forward position shown in FIG. 9, in which wafers are loaded onto or unloaded from cassette 200, and a rearward position near end 98 of rail 90. When carrier 94 is in the rearward position, a cassette is moved from carrier onto the IME 20, or from IME 20 onto carrier, in a manner similar to that described with respect to the exchange of cassettes between the module robot and the elevator.

Before they are moved onto process cassette 200 for subsequent transfer into a process module 14, the wafers are housed in a wafer boat 100 which may be of the type commonly used for wafer storage and transfer. During use of the platform, a boat containing wafers to be loaded onto a cassette is placed on a staging table 102. There are two types of wafer transfer systems available for moving wafers from the boat on staging table 102 onto process cassette 200. One type of system is a batch transfer system, illustrated in FIG. 9, in which grippers 104 are mounted to an articulated robotic arm 106 and are manipulated to engage an entire batch of wafers (which may be 25 or 50 wafers) and to move them onto cassette 200. In such a system, wafer boats 100 are seated on a staging table 102 while a conventional pod door opener (not shown but see opener 110 in FIG. 10) removes the lids from the wafer boats (also called "pods"). After the lids are removed, the entire batch of wafers in the pod is transferred into a process cassette. See wafers 400 in FIG. 9.

Batch transfer systems are conventional in the semiconductor fabrication art. One example of a batch transfer system that may be utilized in the platform 10 is the batch transfer system provided with the STELLARIS ™ 3.18 wet bench provided by SCP Global Technologies, Boise, Id.

Figure 10:
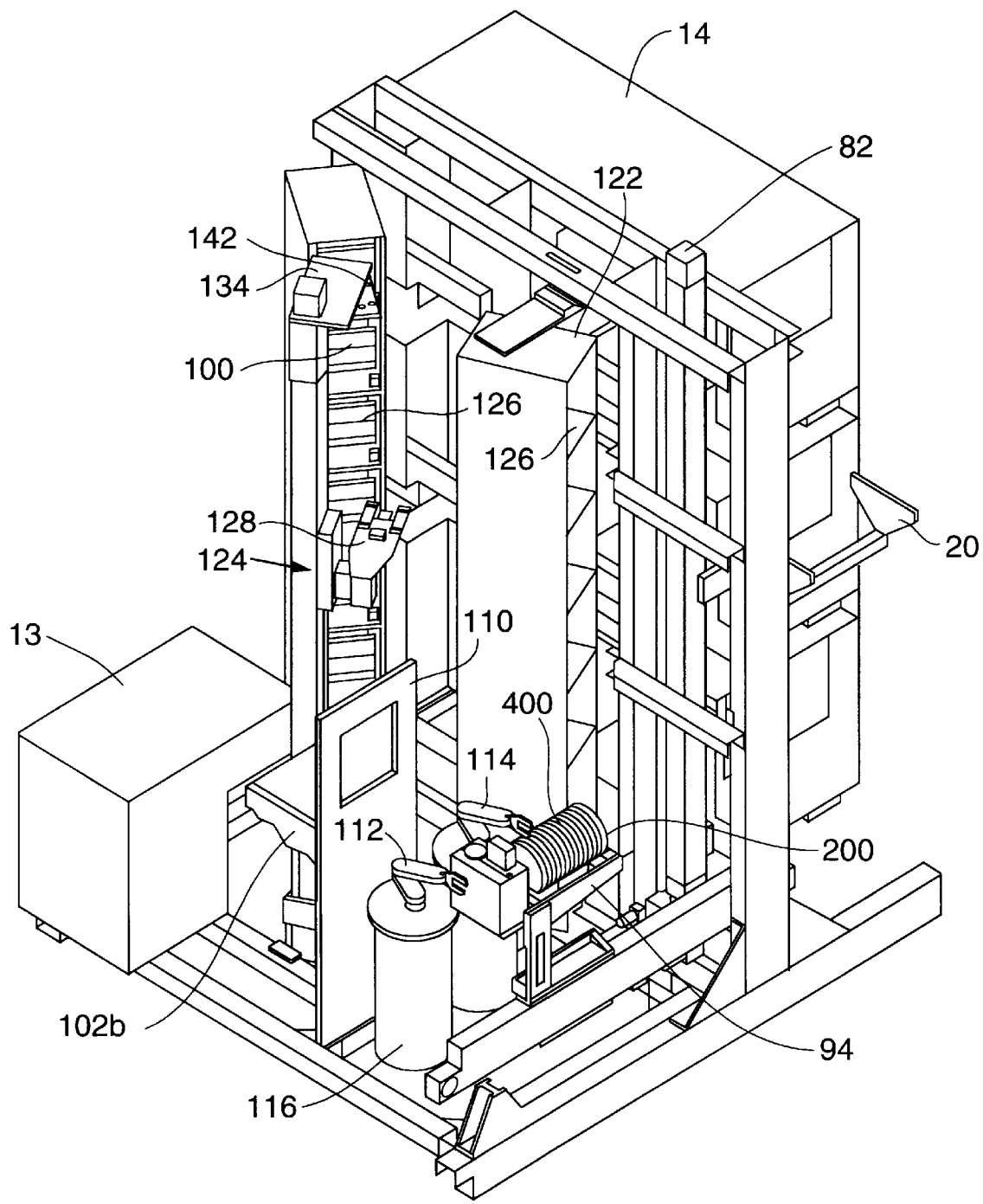
FIG. 10 is a perspective view similar to FIG. 9 of an embodiment of the platform which utilizes a single wafer transfer system.

Another type of wafer system that may be used to move wafers from staging table 102 onto process cassette is a single wafer transfer system 108, such as the one illustrated in FIG. 10. In such a system, wafer boats 100 are seated on a staging table 102*b* of a conventional pod door opener 110 that removes the lids from the wafer boats (also called "pods"). Single wafer transfer system 108 includes a pair of conventional scara-type robots 112, 114 and notch aligner 116. During use, once the pod door is removed, scara-type robot 112 individually removes each wafer from the pod and placing it onto notch aligner 116. Once the wafer notch is found and the wafer properly oriented by notch aligner 116, second scara-type robot 114 carries the aligned wafer from the notch aligner to a cassette 200 positioned on transfer table carrier 94. The scara robots continue this process until the pod is empty, and additional pods are emptied into the cassette in similar fashion until the cassette is filled. A single wafer transfer system of this type is found in the STELLARIS ™ 2.18 wet bench supplied by SCP Global Technologies, Inc., Boise, Id.

Buffer Stocker System

Referring still to FIG. 10, buffer stocker system 22 provides storage capacity within the enclosed main chamber for several batches of wafers and includes automation for moving pods or boats of wafers between input/output port 13, the storage locations, and staging table 102*b* of pod door opener 110. Buffer stocker system 118 includes one or more pod storage shelves 122 circumferentially arranged around a buffer robot 124. In the embodiment shown, storage shelves 122 include a plurality of storage locations 126 arranged vertically so as to minimize the overall footprint of the platform, although various other storage arrangements may be readily utilized.

Figure 11:
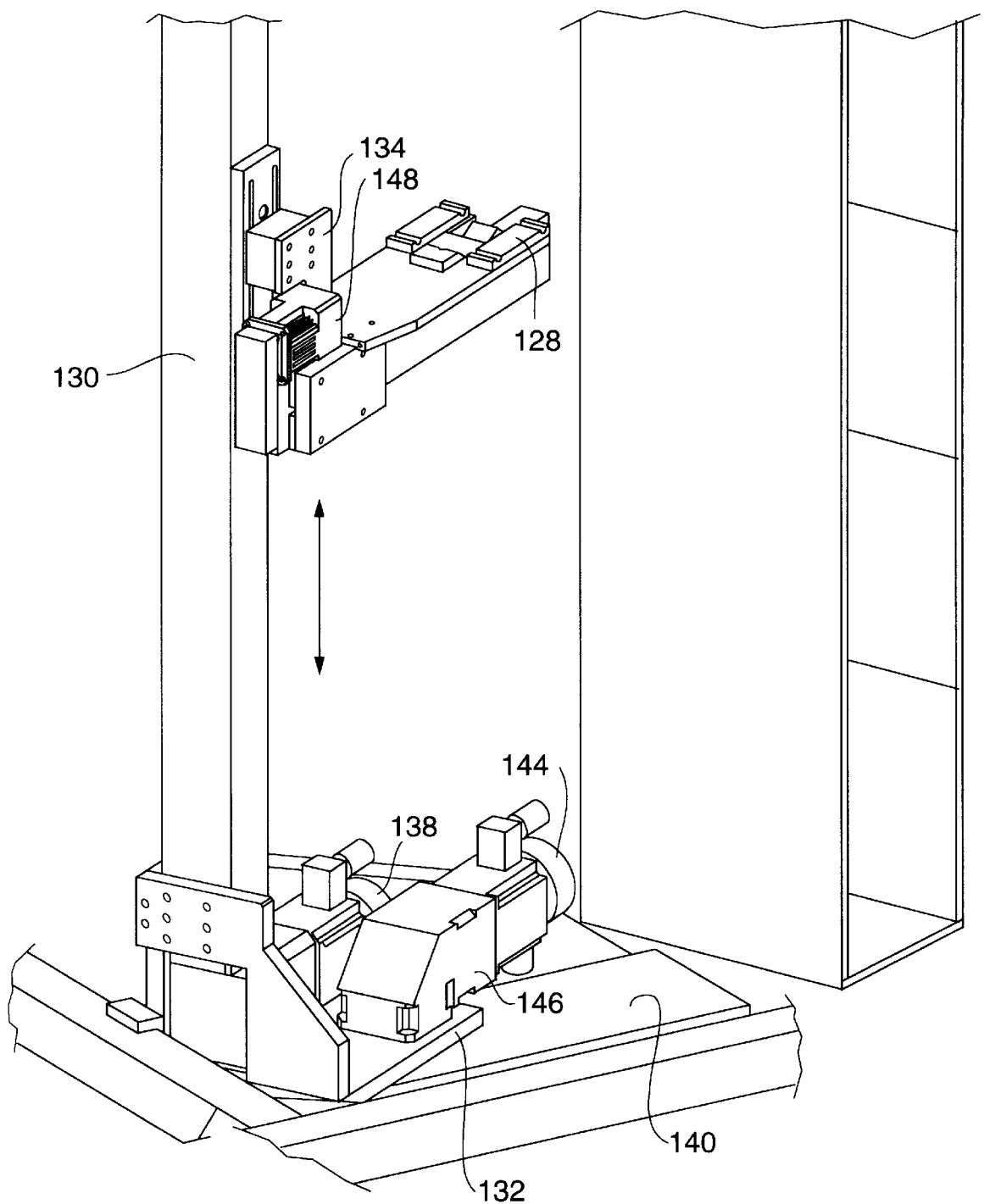
FIG. 11 is a perspective view of a buffer robot useful in the platform of FIG. 1A.

Closer detail of buffer robot 124 is shown in FIG. 11. The robot is provided with a pod grabber 128 and automation needed to move the pod grabber 128 between I/O port 13, each pod location 126, and staging table 102 or 102*b*. To position pod grabber 128 at all of the needed locations, buffer robot 124 must be equipped to move the pod grabber vertically, to rotate the grabber into radial alignment with each pod location 126, and to extend the pod grabber radially into each pod location to engage and release pods. The components utilized for each of these functions will next be described.

Buffer robot 124 includes a vertically oriented rail 130 extending between a lower plate 132 and an upper plate 134 (FIGS. 9 and 10). A belt driven carriage 136 supports pod grabber 128 and is moveable vertically up and down the rail. Motor 138 (FIG. 11) drives the belt (not shown) that moves carriage 132 along its vertical travel.

Positioning grabber 128 into radial alignment with pod storage locations 126 requires rotation of the buffer robot 124 about a vertical axis. Lower plate 132 is mounted to a base member 140 for rotation relative to base member 140 about a vertical axis. Base member 140 is fixed to the platform's frame structure. Upper plate 134 (FIG. 9) is mounted to a ceiling member of the platform for rotation about the vertical axis. Although the ceiling member is not shown, the rotation axis 142 is identified in FIG. 9.

Figure 12A:
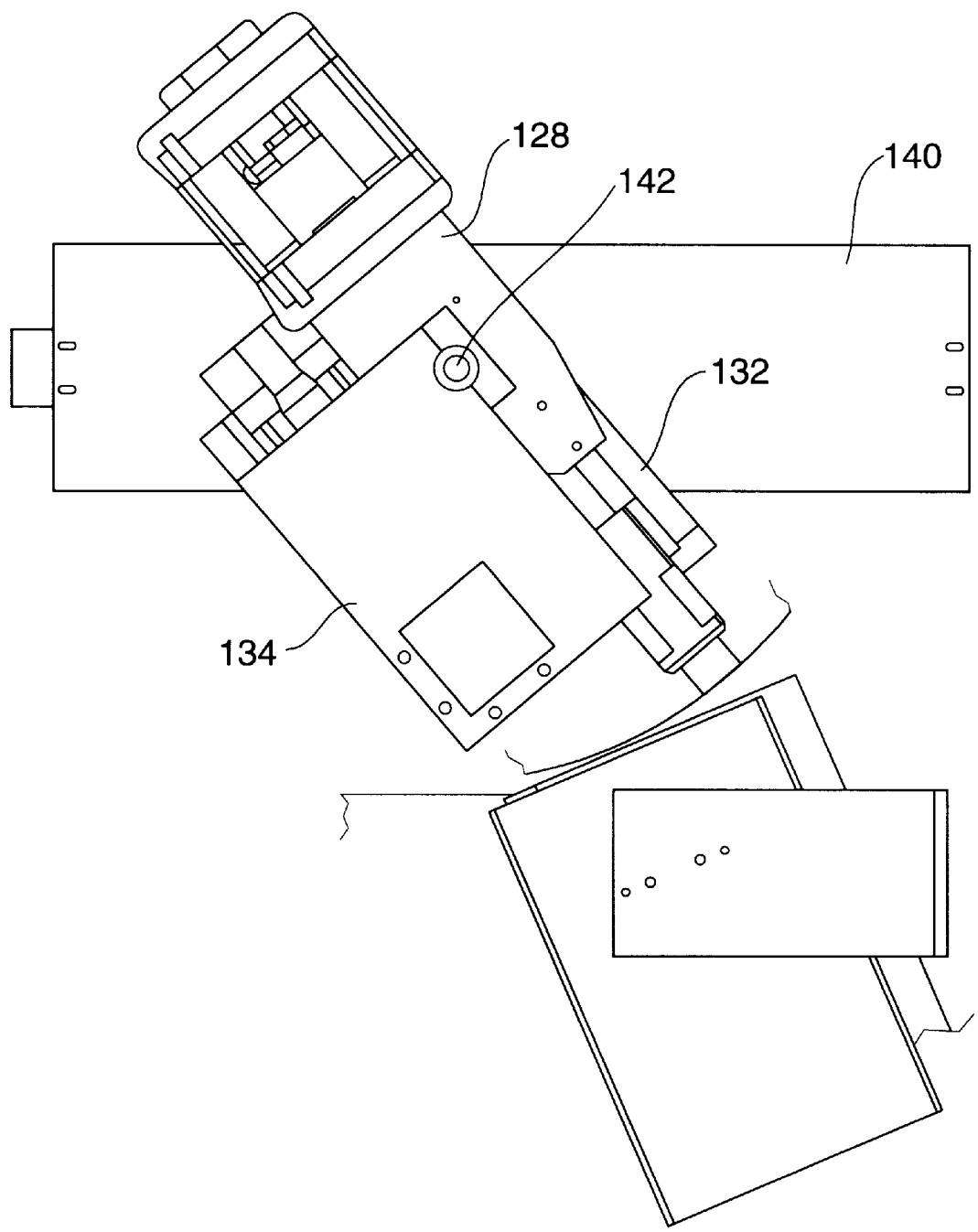
FIGS. 12A and 12B are top plan views of the buffer robot of FIG. 11, showing the robot in two of its rotational positions. Also shown are buffer storage columns.
Figure 12B:
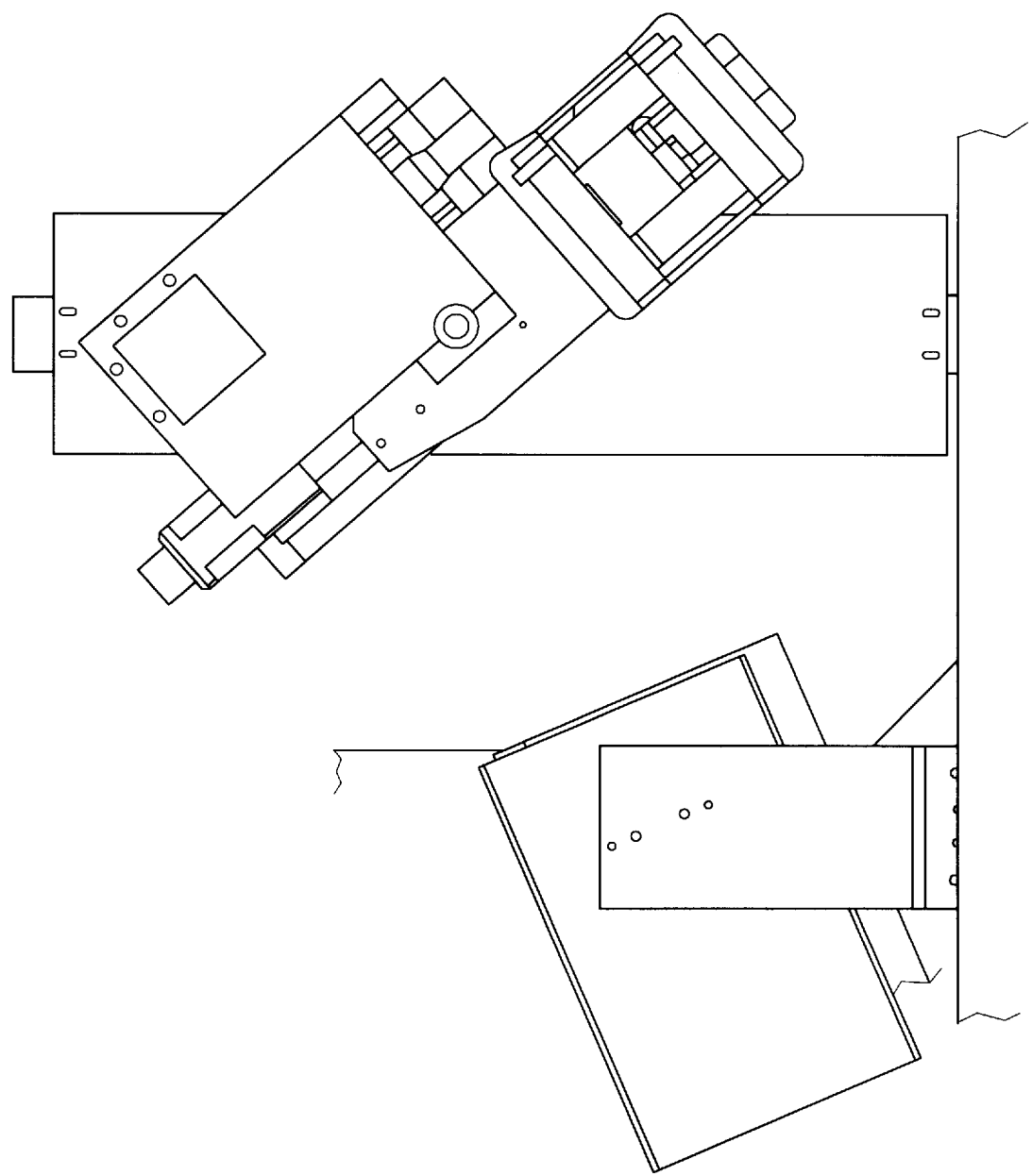

It can be appreciated with reference to the drawings, and in particular FIGS. 12A and 12B, that grabber 128 is radially positioned relative to rotation axis 142. Rotation of plates 132, 134 about axis 142 therefore changes the radial position of the grabber 128.

Referring again to FIG. 11, movement of buffer robot 124 about axis 142 is powered by motor 144, which drives a series of gears in gear box 146 in conventional fashion to rotate lower plate 132 relative to base member 140.

When grabber 128 is radially positioned relative to a storage location 126, it must be extended in a radial direction in order to engage or release a pod at the storage location 126. Grabber 128 is slidable along a horizontal rail 146 having a belt drive component driven by motor 148 to move grabber 128 along the rail 146. See FIGS. 13A and 13B.

Frame and Expansion Unit

Figure 14:
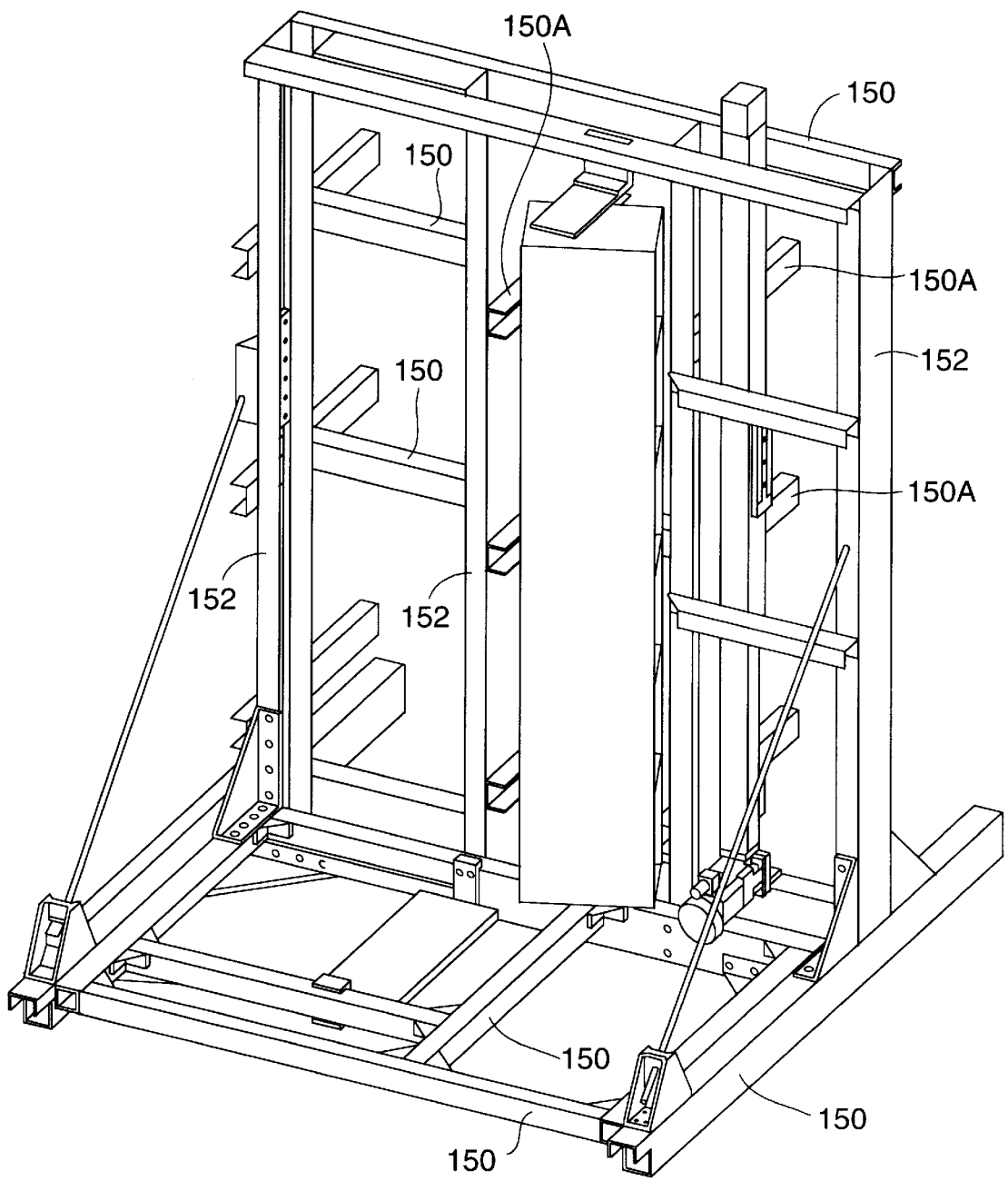
FIG. 14 is a perspective view of the frame of the platform of FIG. 1A.

Referring to FIG. 14, the basic structural support for platform 10 is provided in the form of a number of horizontal structural support members 150 and vertical support members 152 joined together and reinforced with various cables and reinforcing pieces to form a sturdy frame. Structural members 150a support the modules 14. Exterior walls are attached to the frame to form an enclosure around the platform.

An advantage of the frame structure shown is that it allows additional process modules to be easily added to the system without requiring additional platform automation (i.e. automation outside of the process modules). This allows for increased process capacity and/or increased versatility of the platform through the addition of process modules designated to carry out additional processes.

Figure 15:
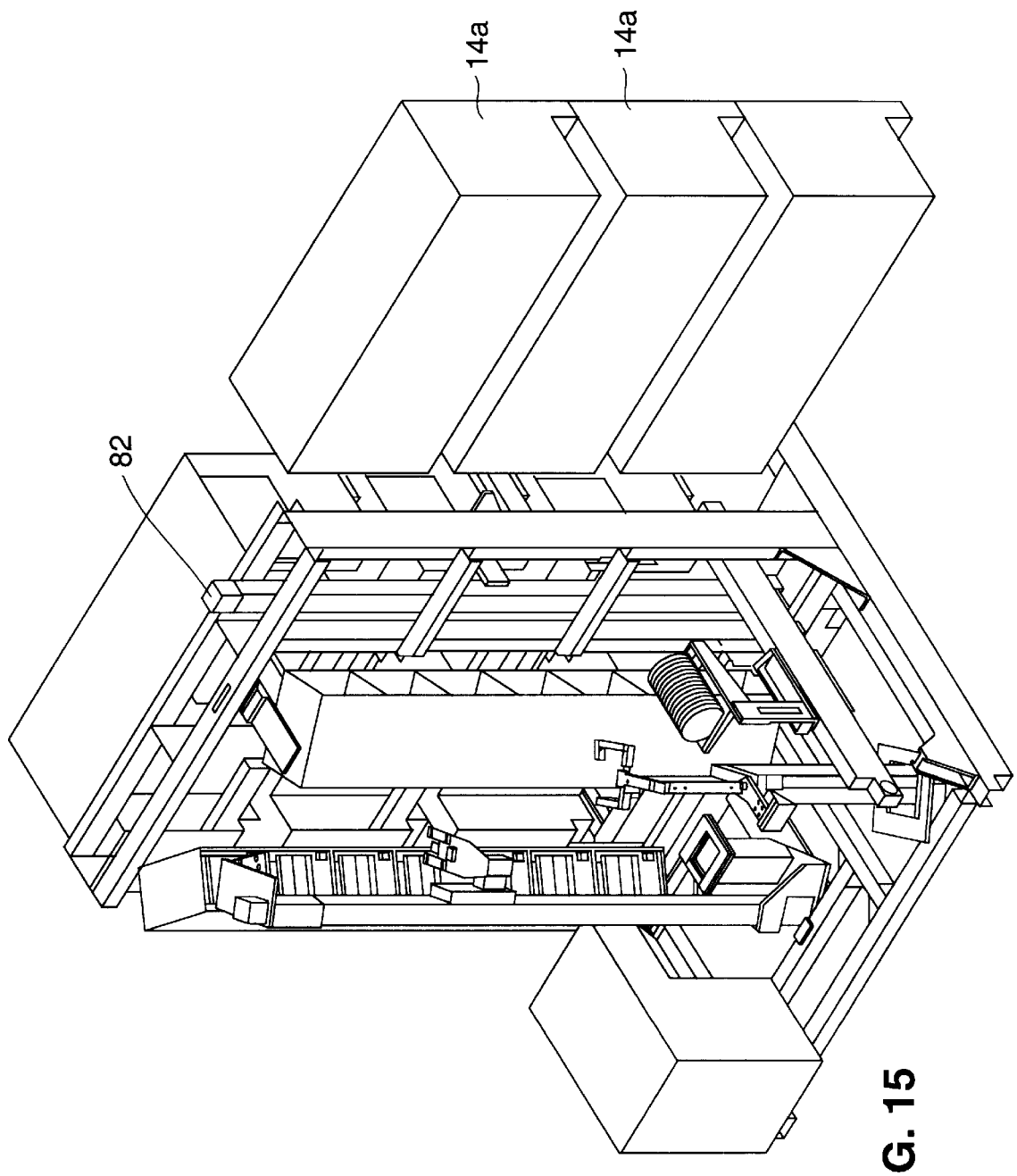
FIG. 15 is a perspective view of the platform of FIG. 1A, showing the positioning of expansion modules added to the platform.

Referring to FIG. 15, additional structural members (not shown) like the members 150, 150a and 152 may be attached to the base frame of FIG. 14, and additional process modules 14a may be mounted to the additional structural members. The entire base and expansion platform would then be enclosed by walls attached to the base and expansion frames. As can be appreciated with further reference to FIG. 15, with the expansion modules arranged symmetrically about IME rail 82, the IME can service both the base modules 14 and the expansion modules 14a without the need for additional automation. Likewise, the automation systems used to form the pipeline for delivery of wafers to the IME 20 also need not be expanded despite additional of expansion modules 14a. Each expansion module 14a is preferably like the modules 14 described above, and include the module automation systems 18 described with reference to FIGS. 4A through 4F.

Another important attribute of the frame is that it permits process modules 14 to be removed from the platform and replaced for service or maintenance. Service actions on a wet processing station must be performed safely, timely, accurately, and according to strict cleanroom protocols. In most fabs, such cleanroom protocols require workspace decontamination before service personnel can perform service on wet processing systems. Chemical protection devices must be worn, chemical inlets must be locked-out, and parts removed must be de-contaminated/contained. The sum of these safety protocols amounts to a highly time consuming process that eats into expensive platform operating time. Mechanically simple repairs such as a pump or valve replacements, can take many hours in wet processing equipment due to chemical safety requirements. This is especially true in light of the compounded effect of tightly packaged workspaces, and the cumbersome nature of chemical protective gear worn by the technician.

By permitting modules to be removed from the platform, platform down time is decreased by allowing service and maintenance to be carried out away from the platform, while operation of the platform continues using a replacement module. Replacement may be carried out simply by removing the outer skin of the platform, removing a module from its structural support members (this naturally will require detaching its plumbing and electrical components) and installing a replacement module.

Processes

A majority of wet cleans performed in present day semiconductor fabrication facilities are based on a core set of operations: organic residue removal, film etchback and removal, particle removal, metal impurity removal, surface passivation (termination), and drying. Each of these cleaning functions may require a different set of hardware to optimize the process results. These individual process chambers also have different environmental sensitivities. For this reason it is advantageous to combine certain process functions into one process environment (module) that has been optimized for process performance, wafer throughput, and other desirable aspects of a wet cleaning platform.

By utilizing self-terminating process modules, semiconductor wafers may be etched, cleaned etc. in individual modules without exposing the outside environment to chemical vapors. This greatly reduces the need for exhaust requirements outside the process chamber, and provides an extra level of safety (or isolation). Examples of processes useful with the modules 14 will next be described.

Heated Acid or Organic Clean Module

One of the modules 14 utilized in platform 10 may be a heated acid or organic clean module that utilizes heated chemicals to remove organic contamination from the wafers. The contained design of the process modules and the self-termination feature of the modules allows containment of hot acid vapors within the module, rinsing of the acid from the wafers and the cassette before their removal from the module, and evacuation of the vapors from the module before module door 24 is opened at the end of the process.

In one embodiment of a module utilized for an organic clean, the tank 16 furthest from the door is used for containing heated $H_2SO_4$ combined with $H_2O_2$ or $O_3$. The tank closest to the door contains a rinse fluid such as deionized water, to which $O_3$ may have been added.

The cassette of wafers is first lowered into the heated chemical tank for the required duration, and then transferred into the rinse tank where cascading rinse fluid rinses the chemical from the wafers, cassette, end effectors, and lid 50. Introduction of the chemicals into the chemical tank occurs only after the module door 24 has been closed and the cassette 100 has been lowered into the tank 16 and the lid 50 (FIG. 4A) has sealed the tank 16. Module door 24 is not opened until the wafers, cassette and lid have been fully rinsed.

Etch/Clean or Core Clean Module

A second one of the modules 14 may be configured as an etch/clean module useful for accomplishing two fundamental operations necessary in the processing of semiconductor wafers: (1) etching of critical films (e.g. SiO2), with appropriate chemicals such as HF, DF or BHF; and (2) removing particles and defects which affect device yield from the wafer surface using deionized water, H2O2, and NH4OH (a procedure known in the industry as "standard clean-1").

In an etch/clean module, each of the process tanks may be capable of performing both functions. One or both of the tanks may include a megasonic or ultrasonic transducer assembly utilized to transmit acoustic energy into the tank to agitate the process fluids and to thus facilitate the cleaning of particles from the wafer surface.

Passivation Module

A passivation module may provide final rinse, dry, and surface termination procedures for the platform. Thus, in the passivation module all functions necessary to complete the surface preparation requirements may be completed in the same chamber without having to compromise the process integrity.

This module consists of one or more drying technologies (for example, spin, IPA vapor, or marangoni), combined with rinse capabilities and, if desired, chemical process capabilities such as etching. In one embodiment, passivation module includes a tank capable of all of these functions. A tank and chemical/rinse/dry system of this kind is shown and described in U.S. application. Ser. No. 09/227,637, Elsawy et al, filed Jan. 8, 1999, which is incorporated herein by reference for all purposes. The system as described in the Elsawy application may be utilized, for example, for drying alone, in which case wet objects may be transferred from a separate wet treatment vessel within the module 14 into the vessel of the drying system. As another example given in that application, the vessel of the drying system may be used for surface passivation processes that precede drying, such as etch, ozone rinse, and DI rinse processes use in wafer processing, as well as for the subsequent drying process. Thus it should be appreciated that the passivation module may include a single process vessel or two or more process vessels, depending on the desired passivation procedures to be utilized. If two or more separate tanks or vessels are utilized in the passivation module, these are preferably serviced by the module automation as described above, in which case Operation Use of the shown embodiment will be described with reference primarily to FIGS. 8A, 9 and 10. During use, a boat/pod 100 of wafers enters the platform through sealable loading/unloading port 13. Buffer robot 24, which as described is moveable in a vertical direction and rotatable 360° around vertical axis 142, engages the pod and moves it to a storage location 126 in the buffer/stocker system. Ultimately, during cassette loading, buffer robot 24 retrieves the pods from the storage locations 126 and positions it onto staging window 102. Buffer robot alternatively carries pods directly from the loading port to the staging window 102 rather than placing them into storage.

After the pod is opened, wafer transfer system 19, which may be a batch transfer or single wafer transfer system as discussed above, moves wafers from the pod onto a cassette 200 seated on slide table carrier 94. Multiple pods are moved to staging window 102 and unloaded in this manner until cassette 200 is full. To expedite the transfer process, multiple wafer transfer systems may be utilized.

Once the cassette is filled, the transfer table automation 84, 88 moves the cassette to the inter-module elevator 20 as described. The IME carries the cassette into horizontal alignment with one of the process chambers/modules (which may or may not be one of the expansion modules 14*a*). The cassette is next engaged by a module robot located within the process chamber/module. The module robot moves the cassette between process vessels within the chamber/ module. Once the process within the chamber/module is completed, the module robot hands the cassette back to the IME, which moves the cassette into horizontal alignment with another chamber/module. The cassette is engaged by the module robot of that module, etc. After the cassette of wafers has been fully processed, the IME delivers it back onto the transfer table 94, and the wafer transfer system moves the wafers individually or in batchs into a pod on the staging window 102. Once full, the pod is carried back to the buffer/stocker by the buffer robot 24.

It should finally be noted that once the IME receives a cassette from the slide table, an additional cassette may be positioned on the slide table 102, loaded with wafers, engaged by the IME and carried between process chambers/ modules while the original cassette is still undergoing processing. It should thus be appreciated that several batches of wafers may be simultaneously moving through the various stages of processing within the platform.

The module automation thus simplifies the scheduling algorithm for the movement of product (wafers) within the system, by handing only moves internal to the process modules while leaving, responsibility for moves outside the process chamber to the IME.

We claim:

1. A multiple stage wet processing platform comprising:
   a sealable enclosure;
   at least two processing modules positioned within the enclosure, each module including;
   a housing having an opening and a door moveable into position covering the opening,
   at least two processing vessels within the housing, and
   an intra-module robot within the housing and including
   a support member, the intra-module robot moveable to a first position in which the support member is disposed in a first one of the processing vessels and a second position in which the support member is disposed in a second one of the processing vessels; and
   an inter-module robot moveable between a first position adjacent to a first one of the modules and a second position adjacent to a second one of the modules.

2. The multiple stage wet processing platform of claim 1 wherein the process modules are self-terminating.

3. The multiple stage wet processing platform of claim 1 wherein, in each process module, one of the process vessels is fluidly coupled to a chemical source and the other one of the process vessels is fluidly coupled to a source of rinse fluid.

4. The multiple stage wet processing platform of claim 1 wherein, in each process module, one of the process vessels is fluid coupled to a chemical source and the other one of the process vessels is fluidly coupled to a source of fluid selected to neutralize the type of chemical contained in the chemical source.

5. The multiple stage wet processing platform of claim 1 further including a drying module, the drying module including:
   a housing having an opening and a door moveable into position covering the opening; and
   a drying vessel within the housing, the drying vessel fluidly coupled to a source of drying fluid.

6. The multiple stage wet processing platform of claim 5 wherein the drying vessel is fluidly coupled to a source of rinsing fluid.

7. The multiple stage wet processing platform of claim 6 wherein the drying vessel is fluidly coupled to a source of treatment chemical.

8. The multiple stage wet processing platform of claim 5 wherein the inter-module robot is further moveable to a third position adjacent to the drying module.

9. The multiple stage wet processing platform of claim 1 wherein each intra-module robot is cooperatively associated with the inter-module robot to transfer objects between the intra-module robots and the inter-module robot.

10. A multiple stage wet processing platform comprising:
    a sealable enclosure;
    a first processing module positioned within the enclosure, the first processing module including;
    a housing having an opening and a door moveable into position covering the opening,
    at least two processing vessels within the housing, and
    an intra-module robot within the housing and including
    a wafer support member, the intra-module robot moveable to a first position in which the support is disposed in a first one of the processing vessels and a second position in which the support is disposed in a second one of the processing vessels;
    a second processing module positioned within the enclosure, the second processing module including at least one process vessel; and an inter-module robot moveable between a first position adjacent to a first one of the modules and a second position adjacent to a second one of the modules.

11. The multiple stage wet processing platform of claim 10 wherein:
the process vessel in the second module includes a source of drying vapor fluidly coupled thereto.

12. The multiple stage wet processing platform of claim 11 wherein the process vessel in the second module further includes a source of rinsing fluid fluidly coupled thereto.

13. The multiple stage wet process platform of claim 10 wherein the first module is self-terminating.

14. The multiple stage wet processing platform of claim 10 wherein, in the first module, a first one of the processing vessels is fluidly coupled to a chemical source, and a second one of the processing vessels is fluidly coupled to a source of fluid selected to neutralize the type of chemical contained at the chemical source.

15. The multiple stage wet processing platform of claim 10 wherein the intra-module robot is cooperatively associated with the inter-module robot to transfer objects between the intra-module robot and the inter-module robot.

16. The multiple stage wet processing platform of claim 10, further including:
a third processing module positioned within the enclosure, the third processing module including;
a housing having an opening and a door moveable into position covering the opening,
at least two processing vessels within the housing, and an intra-module robot within the housing and including a wafer support member, the intra-module robot moveable to a first position in which the support is disposed in a first one of the processing vessels and a second position in which the support is disposed in a second one of the processing vessels,
wherein each of the intra-module robots are cooperatively associated with the inter-module robot to transfer objects between the intra-module robots and the inter-module robot.

17. The multiple stage wet processing platform of claim 16 wherein the first processing module is a heated acid module, the second processing module is a core clean module, and the second processing module is a surface passivation module.

18. The multiple stage wet processing platform of claim 10 wherein the modules are arranged vertically.

19. The multiple stage wet processing platform of claim 10 wherein the modules are arranged to at least partially surround the inter-module robot.

20. The multiple stage wet processing platform of claim 10, wherein the intra-module robot includes a vessel lid moveable by the robot into a first position covering the first processing vessel and a second position covering the second processing vessel.

21. The multiple stage wet processing platform of claim 10, further including:
a port in the enclosure:
a plurality of buffer storage shelves within the enclosure; and
a buffer robot moveable between the port and the plurality of storage shelves.

22. The multiple stage wet processing platform of claim 21 wherein at least a portion of the buffer storage shelves are vertically arranged on a tower.

23. The multiple stage wet processing platform of claim 21 wherein at least a portion of the buffer storage shelves are circumferentially spaced around the buffer robot.

24. The multiple stage wet processing platform of claim 21 wherein the buffer storage shelves are vertically arranged on towers spaced circumferentially around the buffer robot.

25. The multiple stage wet processing platform of claim 10 wherein the intra-module robot includes a sealed housing, at least one motor within the sealed housing, an inductive receiver within the sealed housing, and an inductive transmitter external to the sealed housing and positioned remotely of the sealed housing.

26. The multiple stage wet processing platform of claim 10, further including a plurality of expansion modules, the expansion modules attachable to the platform to increase the capacity of the platform.

27. The multiple stage wet processing platform of claim 26 wherein, when the expansion modules are attached to the platform, the intermodule robot is further moveable between a position adjacent to a first one of the expansion modules and a position adjacent to a second one of the expansion modules.

28. The multiple stage wet processing platform of claim 27 wherein the modules are arranged vertically, wherein the expansion modules are attachable to the platform in a vertical arrangement, and wherein when the expansion modules are attached to the platform the inter-module robot is disposed between the modules and the expansion modules.

29. A wet processing chamber including:
a housing having an opening and a door moveable into position covering the opening,
least two processing vessels within the housing, and
an intra-module robot within the housing and including a support member and a lid, the intra-module robot moveable to a first position in which the support member is disposed in a first one of the processing vessels and in which the lid covers the first one of the processing vessels, and a second position in which the support member is disposed in a second one of the processing vessels and the lid covers the second one of the processing vessels.

30. A processing chamber including:
a housing having an opening and a door moveable into position covering the opening,
at least two processing vessels within the housing, and
an intra-module automation system within the housing, the intra-module robot moveable to a first position in which the support member is disposed in a first one of the processing vessels, and a second position in which the support member is disposed in a second one of the processing vessels, the automation system including,
an object support member,
a sealed robot housing coupled to the support member, the sealed housing containing at least one motor and an inductive receiver electrically coupled to the motor;
an inductive transmitter external to the sealed robot housing and positioned remotely of the sealed robot housing, the motor responsive to inductive signals transmitted from the transmitter to the receiver to activate the intra-module automation.

* * * * *

UNITED STATES PATENT AND TRADEMARK OFFICE
CERTIFICATE OF CORRECTION

PATENT NO.: 6,138,694
DATED: October 31, 2000
INVENTOR(S): ERIC T. HANSEN ET AL.

It is certified that errors appear in the above-identified patent and that said Letters Patent is hereby corrected as shown below:

Col. 14, Line 28, Change "fluid" to --fluidly--

Col. 16, Line 33, Change "least" to --at least--

Signed and Sealed this

Twenty-ninth Day of May, 2001

Attest:

NICHOLAS P. GODICI

Attesting Officer

Acting Director of the United States Patent and Trademark Office